United States Patent
Lee et al.

(10) Patent No.: US 8,802,609 B2
(45) Date of Patent: Aug. 12, 2014

(54) NITRILE AND AMIDOXIME COMPOUNDS AND METHODS OF PREPARATION FOR SEMICONDUCTOR PROCESSING

(75) Inventors: Wai Mun Lee, Milpitas, CA (US); Hua Cui, Castro Valley, CA (US); Mark A. Scialdone, West Grove, PA (US); Albert G. Anderson, Wilmington, DE (US)

(73) Assignee: EKC Technology Inc

( * ) Notice: Subject to any disclaimer, the term of this patent is extended or adjusted under 35 U.S.C. 154(b) by 377 days.

(21) Appl. No.: 13/354,145

(22) Filed: Jan. 19, 2012

(65) Prior Publication Data

US 2013/0035272 A1  Feb. 7, 2013

Related U.S. Application Data

(63) Continuation-in-part of application No. 12/881,090, filed on Sep. 13, 2010, now abandoned, which is a continuation-in-part of application No. 12/260,389, filed on Oct. 29, 2008, now abandoned.

(60) Provisional application No. 61/000,727, filed on Oct. 29, 2007, provisional application No. 61/088,817, filed on Aug. 14, 2008.

(51) Int. Cl.
| | |
|---|---|
| *C11D 3/60* | (2006.01) |
| *C11D 11/00* | (2006.01) |
| *C11D 7/32* | (2006.01) |
| *C11D 3/43* | (2006.01) |
| *H01L 21/02* | (2006.01) |

(52) U.S. Cl.
CPC .......... *C11D 11/0047* (2013.01); *C11D 7/3209* (2013.01); *C11D 3/43* (2013.01); *H01L 21/02057* (2013.01)

USPC .......................................... 510/175; 510/176

(58) Field of Classification Search
CPC .... C11D 11/0047; C11D 7/3209; C11D 3/43; H01L 21/02057
USPC .................................................. 510/175, 176
See application file for complete search history.

(56) References Cited

U.S. PATENT DOCUMENTS

| | | |
|---|---|---|
| 3,480,391 A | 11/1969 | Carlos |
| 3,544,270 A | 12/1970 | Carlos et al. |
| 3,794,488 A | 2/1974 | Henn et al. |

(Continued)

FOREIGN PATENT DOCUMENTS

| | | |
|---|---|---|
| DE | 3343597 | 6/1985 |
| DE | 3343599 | 6/1985 |

(Continued)

OTHER PUBLICATIONS

PCT/US2008/012234 (WO2009/058272), International Search Report and Written Opinion mailed Feb. 16, 2009, 10 pgs.

(Continued)

*Primary Examiner* — Gregory Webb
(74) *Attorney, Agent, or Firm* — Simon L. Xu

(57) ABSTRACT

Semiconductor processing compositions comprising amidoxime compounds having two or more amidoxime functional groups and their use in semiconductor processing to remove photoresist, polymeric materials, etching residues and copper oxides from semiconductor substrates, particularly substrates comprising copper, low-k dielectric material, titanium nitride, and/or titanium oxynitride.

12 Claims, 9 Drawing Sheets

(56) References Cited

U.S. PATENT DOCUMENTS

| | | |
|---|---|---|
| 3,882,018 A | 5/1975 | Depree |
| 4,413,999 A | 11/1983 | Linder et al. |
| 4,551,318 A | 11/1985 | Grosskinsky et al. |
| 4,576,804 A | 3/1986 | Grosskinsky et al. |
| 4,629,613 A | 12/1986 | Grosskinsky et al. |
| 4,634,584 A | 1/1987 | Grosskinsky et al. |
| 5,808,150 A | 9/1998 | Michelotti |
| 5,981,454 A | 11/1999 | Small |
| 6,534,681 B1 | 3/2003 | Watzenberger et al. |
| 6,546,939 B1 | 4/2003 | Small |
| 6,800,105 B2 | 10/2004 | Ueda et al. |
| 6,942,820 B2 | 9/2005 | Ihara et al. |
| 6,978,724 B2 | 12/2005 | Anderson et al. |
| 7,220,322 B1 | 5/2007 | Sun et al. |
| 7,316,977 B2 | 1/2008 | Siddiqui et al. |
| 7,838,483 B2 | 11/2010 | Lee et al. |
| 8,062,429 B2 | 11/2011 | Lee |
| 2003/0119692 A1 | 6/2003 | So et al. |
| 2003/0171239 A1 | 9/2003 | Patel et al. |
| 2003/0235989 A1 | 12/2003 | Jayashankar |
| 2004/0162226 A1* | 8/2004 | Sunder et al. ............ 510/220 |
| 2005/0182118 A1 | 8/2005 | Kong et al. |
| 2007/0007196 A1 | 1/2007 | Komatsu et al. |
| 2009/0107520 A1* | 4/2009 | Lee et al. ............ 134/2 |
| 2009/0111965 A1* | 4/2009 | Lee ............ 528/229 |
| 2009/0112024 A1 | 4/2009 | Lee |
| 2009/0130849 A1 | 5/2009 | Lee |
| 2009/0133716 A1 | 5/2009 | Lee |
| 2009/0137191 A1 | 5/2009 | Lee |
| 2010/0065090 A1* | 3/2010 | Tropsch ............ 134/34 |
| 2010/0105594 A1* | 4/2010 | Lee et al. ............ 510/176 |
| 2010/0105595 A1* | 4/2010 | Lee ............ 510/176 |
| 2010/0215841 A1* | 8/2010 | Thompson ............ 427/96.4 |
| 2010/0294309 A1* | 11/2010 | Tropsch ............ 134/18 |
| 2011/0045203 A1* | 2/2011 | Grovola et al. ............ 427/535 |
| 2011/0065622 A1* | 3/2011 | Lee et al. ............ 510/176 |
| 2011/0180747 A1* | 7/2011 | Lee ............ 252/79.1 |
| 2012/0048295 A1* | 3/2012 | Du et al. ............ 134/3 |
| 2012/0160266 A1* | 6/2012 | Thompson ............ 134/3 |
| 2013/0261039 A1* | 10/2013 | Little ............ 510/175 |
| 2013/0296214 A1* | 11/2013 | Barnes et al. ............ 510/176 |

FOREIGN PATENT DOCUMENTS

| | | |
|---|---|---|
| EP | 1167290 | 1/2002 |
| EP | 1610365 | 12/2005 |
| EP | 1266956 | 4/2006 |
| WO | 01/62710 | 8/2001 |
| WO | 2004/099086 | 11/2004 |
| WO | 2005/072338 | 8/2005 |
| WO | 2006/036368 | 4/2006 |
| WO | 2006/062178 | 6/2006 |
| WO | 2006/107517 | 10/2006 |
| WO | 2007/050409 | 5/2007 |
| WO | 2009/058272 | 5/2009 |
| WO | 2009/058273 | 5/2009 |
| WO | 2009/058274 | 5/2009 |
| WO | 2009/058275 | 5/2009 |
| WO | 2009/058277 | 5/2009 |
| WO | 2009/058278 | 5/2009 |
| WO | 2009/058287 | 5/2009 |
| WO | 2009/058288 | 5/2009 |
| WO | 2009/085072 | 7/2009 |

OTHER PUBLICATIONS

PCT/US2008/012235 (WO2009/058273), International Search Report and Written Opinion mailed Feb. 11, 2009, 8 pgs.
PCT/US2008/012236 (WO2009/058274), International Search Report and Written Opinion mailed Feb. 16, 2009, 9 pgs.
PCT/US2008/012237 (WO2009/085072), International Search Report and Written Opinion mailed Feb. 16, 2009, 10 pgs.
PCT/US2008/012238 (WO2009/058275), International Search Report and Written Opinion mailed Feb. 13, 2009, 9 pgs.
PCT/US2008/012240 (WO2009/058277), International Search Report and Written Opinion mailed Feb. 16, 2009, 9 pgs.
PCT/US2008/012241 (WO2009/058278), International Search Report and Written Opinion mailed Feb. 13, 2009, 9 pgs.
PCT/US2008/012253 (WO2009/058287), International Search Report and Written Opinion mailed Feb. 16, 2009, 10 pgs.
PCT/US2008/012254 (WO2009/058288), International Search Report and Written Opinion mailed Feb. 20, 2009, 7 pgs.

* cited by examiner

NITRILE AND AMIDOXIME COMPOUNDS AND METHODS OF PREPARATION FOR SEMICONDUCTOR PROCESSING

CROSS REFERENCE TO RELATED APPLICATIONS

This application is a continuation-in-part of U.S. application Ser. No. 12/881,090, filed Sep. 13, 2010, now abandoned which in turn is a continuation-in-part of U.S. application Ser. No. 12/260,389, filed Oct. 10, 2008, now abandoned which in turn claims priority to U.S. Provisional Application 61/000,727, entitled "Compositions Comprising Chelating Agents Containing Amidoxime Compounds" (filed Oct. 29, 2007), and U.S. Provisional Application No. 61/088,817 entitled "Novel Nitrile and Amidoxime Compounds and Methods of Preparation" (filed Aug. 14, 2008) all of which are incorporated herein by reference in their entirety.

FIELD OF THE INVENTION

The present invention relates to semiconductor processing compositions comprising amidoxime compounds. The present invention also relates to the preparation of nitrile compounds and their conversion into amidoxime compounds for semiconductor processing compositions.

BACKGROUND OF THE INVENTION

In the standard manufacture of an integrated circuit, typically more than one hundred steps are carried out that involve wafer cleaning or surface preparation. These steps range from removing residues intentionally placed on the surface, such as a post-resist strip/ash residual removal step, to the preparation of a surface for subsequent processing, such as by removing native oxide at a surface, and to etching itself. As a result, a variety of methods to treat surfaces are required.

Most cleaning or surface preparation steps are carried out in the 'wet', in other words by treating a substrate with a liquid composition. Typically (but not always), the cleaning effect of an active species is increased with its concentration, and, therefore, in order to maximize the cleaning effect of the liquid composition, the concentration of the active species is ideally maximized. However, due to cost, environmental and safety concerns, cleaning and surface preparation is increasingly being carried out by using dilute compositions. In order to compensate for possible changes in the cleaning effect at lower concentrations, the cleaning or surface preparation may be aided by the use of some form a mechanical energy, such as megasonics or jet-spray processing.

Accordingly, there is a need for chemistries that can be used in both single-wafer and batch processing while addressing a variety of goals in the cleaning or surface preparation process.

One specific cleaning or surface preparation step is the removal of residues containing metallic species. The metallic species may be left on the surface of a wafer substrate after, for example, chemical mechanical polishing, or what is more typically referred to as chemical mechanical planarization (CMP). CMP is described in more detail in Kumar et al., Chemical mechanical planarization for microelectronics, Applications Materials Science and Engineering R 45 (2004) 89-220. Typically, in order to remove these residues, a liquid composition comprising a complexing agent is used. The complexing agent attaches to positively charged metal ion species by coordination through a non-metal atom electron donors such as nitrogen and oxygen functionalities. The resulting complex can serve several functions. For example, if the complex is more soluble than the metal species by itself, it facilitates removal of the metal ion from the surface. Alternatively, if the complexed product is not soluble in solution, it becomes a passivating agent by forming an insoluble film on top of the metal surface.

One problem with current ingredients in semiconductor processing fluids is that they have a tendency not only to serve their intended function, such as the removal of residues from processing, but also can remove both metals and their oxides, such as copper and copper oxide, especially in the case with acidic complexing agents, such as citric acid which can lead to failure of the semiconductor device. Accordingly, there is a need for semiconductor cleaning fluids and processing agents that are not aggressive in this way towards metal substrates, while effectively serving their intended function, such as providing for the chelation of metal ion residues and particles created during the manufacturing processes.

SUMMARY OF THE INVENTION

The present invention provides for cleaning formulation and processing agent compositions and kits suitable for use in semiconductor processing (i.e., residue removal and resist stripping) comprising at least one compound containing at least two amidoxime functional groups. The present invention also provides for compositions suitable for use in removing photoresist, polymeric materials, etching residues and copper oxides from substrates comprising copper, low-k dielectric material, titanium nitride, and/or titanium oxynitride with significant titanium nitride or titanium oxynitride etch rate.

Metal chelating functionalites are known in the art. A potent chelating functionality for metal ions are amidoximes (Borrull, F.; Guasch, J.; Casassas, E.; Cerda, V. *Polyhedron*, 1986, 5(7), 1277-1294), which are derived from the addition of hydroxylamines and/or substituted hydroxylamines to nitriles as shown generally in Eqn. 1.

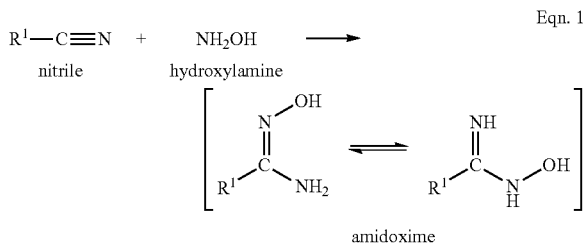

There exists a wide accessibility of nitrile-containing compounds by known preparation methods in the art and which can be synthesized by reaction of acrylonitrile with molecules possessing protic nucleophilic functionality, such as alcohols and amines.

The present invention further provides a process for manufacturing a semiconductor device, the process comprising treating a substrate with a semiconductor processing composition according to the invention. The present invention further provides the use of the semiconductor processing composition in semiconductor processing. The present invention further relates to a method for preparing a semiconductor processing composition comprising one or more amidoxime compounds, each of which having multiple, i.e., two or more, amidoxime functional groups. Amidoxime compounds produced by: (a) mixing a cyanoethylation catalyst, a nucleophile and an unsaturated nitrile to produce a cyanoethylation product; and (b) converting a cyano group in the cyanoethylation product into an amidoxime by treatment with hydroxylamine or substituted hydroxylamine derivatives are useful in a wide variety of semiconductor processing compositions within the scope of the inventive features described herein.

One embodiment of the invention is a semiconductor processing composition comprising at least one compound containing multiple, i.e., at least two, amidoxime functional groups. The semiconductor processing composition may be substantially free from metal ions and completely water soluble at the concentrations used.

In one embodiment of the invention, the semiconductor processing composition is used in a process for manufacturing a semiconductor device which includes the step of treating a substrate with the semiconductor processing composition in a formulated cleaning product or processing agent.

The amidoxime functional groups present in these compounds may exist in either of the following tautomeric structures:

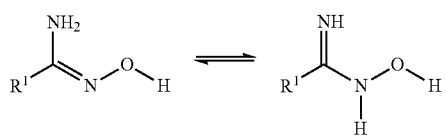

Wherein $R^1$ is independently selected from alkyl, heteroalkyl, aryl, heteroaryl, and alkylaryl groups and possesses multiple amidoxime functional groups.

In another embodiment, the amidoxime groups in the composition are obtained by reaction of one or more of the nucleophiles in a compound with an unsaturated nitrile compound and subsequent conversion of the nitrile groups into amidoxime groups by reaction with hydroxylamine.

In yet another embodiment, a preferred compound containing multiple, i.e., two or more, amidoxime functional groups in the semiconductor processing composition is 1,2,3,4,5,6-hexakis-O-[3-(hydroxyamino)]-3-iminopropyl hexitol, derived from cyanoethylated sorbitol by reaction with hydroxylamine or hydroxylamine derivatives.

In yet another embodiment, the compound containing multiple, i.e., two or more, amidoxime functional groups in the semiconductor processing composition is selected from any of the nitrile containing compounds synthesized by cyanoethylation of other nucleophilic compounds that can react with multiple equivalents of acrylonitrile or other unsaturated nitriles to form polynitriles which are converted to their corresponding amidoximes by reaction with hydroxylamine or hydroxylamine derivatives. A wide variety of nucleophilic compounds are known in the art to react with multiple equivalents of acrylonitrile or similarly with other unsaturated nitriles to form polynitriles, such as those described in "The Chemistry of Acrylonitrile", Second Edition. American Cyanamid Company, NY, 1959, 272 pp. Library of Congress Catalog 59-14 645.

Acrylonitrile also undergoes a conjugate addition reaction commonly referred to as Michael addition with protic nucleophiles such as alcohols and amines which is termed cyanoethylation as shown in Eqn. 2.

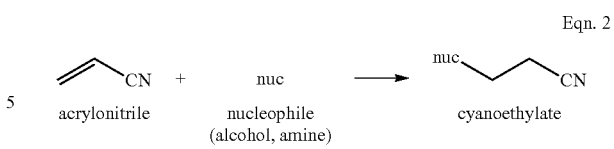

Eqn. 2

Carbon-based nucleophiles are also described in the art to undergo Michael addition to acrylonitrile, such as those that bear acidic hydrogens alpha-to cabonyl groups such as aldehydes, ketones, esters, amides and other carboxylate derivatives.

There exists a wide accessibility of nitrile-containing molecules by known preparation methods in the art. Among these are cyanide addition reactions, such as hydrocyanation, cyanide addition reactions, polymerization of nitrile containing monomers and dehydration of amides.

Nitrile syntheses from other compounds are well known in the art (see R. C. Larock, *Comprehensive Organic Transformations, A Guide to Functional Group Preparations*, VCH Publishers Inc. 1989, p. 1014). Compounds possessing multiple nitrile groups are particularly useful for practicing this invention.

DETAILED DESCRIPTION OF THE INVENTION

Figure 1A:
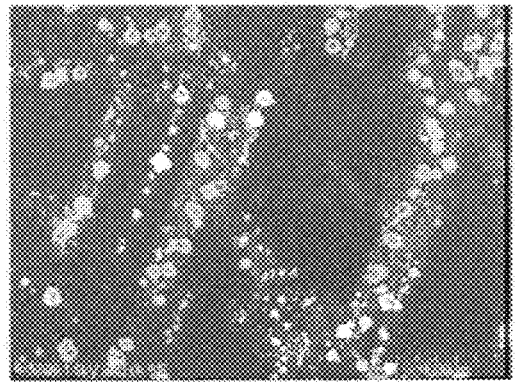
FIG. 1a is an SEM image of a copper surface oxidized by water immersion.

The present invention relates to a semiconductor processing composition for use in semiconductor processing. Semiconductor processing compositions are well known in the art. A semiconductor processing composition is typically substantially free of metal ions. For example, the total concentration of metal ions can be about 100 ppm (parts per million) by weight or less, such as about 10 ppm by weight or less, for example about 1 ppm by weight or less, or as low as about 100 ppb (parts per billion) or less, for example about 10 ppb or less. This requires the composition to have been treated carefully in order to prevent contamination of the composition with metal ions. For example, if the composition comprises water, the water is preferably specifically prepared ultra-high purity water. In addition, if glassware that has not been carefully cleaned is used to prepare the composition, metal ions can leach into the composition from the glassware, thereby making the composition unsuitable for use as a semiconductor processing composition. Furthermore, if reagents comprising metal ions are used to manufacture or purify the components of the composition, the final composition is typically not substantially free of metal ions unless it has been carefully handled and treated. The viscosity and surface tension of semiconductor processing compositions can also be tailored according to its use.

Semiconductor processing refers generally to any step involved in the manufacture of an integrated circuit from a semiconductor substrate. Semiconductor processing includes residue removal, CMP and resist stripping. Thus, the semiconductor processing composition of the present invention can be used in, but is not limited to use in, residue removal, resist stripping, post-CMP clean, and as an additive for CMP slurries.

In one embodiment, the present invention also provides a kit comprising a semiconductor processing composition for use in semiconductor processing and a semiconductor treatment apparatus. Semiconductor treatment apparatuses are well known in the art. The apparatus may, for example, be a CMP apparatus commonly referred to as a tool used in semiconductor processing. Examples of semiconductor processing apparatuses and tools are well known in the art. Semiconductor processing apparatus, for example, need to be kept in a highly clean environment, for example in a clean room environment, so that they are suitable for use in semiconductor processing.

The term "kit" refers to the combination of the semiconductor processing composition and the semiconductor processing apparatus. The kit may for example be provided to an end user as a single item or the kit may be provided as separate parts and combined at the point of use. If, for example, the kit comprises a CMP apparatus, the semiconductor processing composition may be intended for use either with the apparatus itself (for example as an additive in CMP) or in a step subsequent to (e.g. directly after) the treatment of a substrate with the apparatus (for example in a post-CMP cleaning step).

The semiconductor processing composition of the present invention, whether provided as a kit or by itself, comprises an amidoxime compound. For completeness, it is noted that the term "compound" includes within its scope, but is not limited to, small molecules (e.g., having a molecular weight of 1000 or below, for example 500 or below, such as 300 or below), oligomers and polymers.

The use of amidoxime compounds in semiconductor processing has already been described in U.S. 61/000,727 (to Wai Mun Lee, entitled "Composition comprising Chelating agents containing Amidoxime Compounds"). This application is incorporated by reference herein in its entirety. This application relates to the use of amidoxime compounds possessing multiple amidoxime functional groups in semiconductor processing, and, more specifically, they can be used in a composition for removal of metal-containing residues from a substrate wafer surface.

The semiconductor processing composition may comprise simply an amidoxime compound possessing multiple, i.e., at least two or more, amidoxime functional groups by itself or it may comprise other components. Accordingly, the amidoxime is dissolved or suspended in a suitable solvent, and other components may also be included in the semiconductor processing composition. For example, acids; bases; activators, hydroxylamine and hydroxylamine derivatives; other chelating agents; surface passivation agents, reducing agents and surfactants all may be included in the semiconductor processing composition.

The preferred solvent in the liquid semiconductor processing composition may be water or a water based solution containing other dissolved ions or compounds. Alternatively, the solvent may be water with a co-solvent (i.e., a solvent that is miscible with water) or water with a separate immiscible solvent. Alternatively, the solvent may be water-free (e.g., having a water content of $10^{-3}$ mol/dm$^3$ or less). The amidoxime is preferably soluble in the solvent system used, although it can be provided in other forms, for example as a suspension. The amidoxime may be water soluble.

The amidoxime molecules can comprise two or more amidoxime functional groups. In a preferred embodiment of the invention the amidoxime molecule comprises at least two amidoxime functional groups, and up to 8 or more amidoxime functional groups.

For some embodiments, a greater number amidoxime groups in a single molecule is advantageous because it allows for multi-dentate chelating and binding of metal-containing species.

In other embodiments, water and/or solvent soluble ligands are preferred.

The present invention further provides a process for producing a semiconductor device for electronic applications, the process comprising treating a substrate with a semiconductor processing composition of the present invention. In some embodiments, the total concentration of amidoximes in solution will be 1 mol/dm$^3$ or less, for example 0.1 mol/dm$^3$ or less. In other embodiments, higher concentrations of amidoximes will be used.

The Amidoxime Functional Group

The amidoxime functional group may have the following chemical formula:

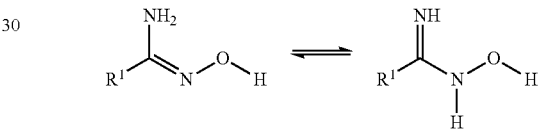

The Group Appending the Carbon Center of the Amidoxime Functional Group

The $R^1$ group (the group directly joined to the carbon center of the amidoxime group), may contain any number of carbon atoms (including zero). While groups having a lesser number of carbon atoms tend to be more soluble in polar solvents, such as DMSO and water (DMSO may also be used as a co-solvent with water), groups having a greater number of carbons can have other advantageous properties, for example surfactant properties. Therefore, in one embodiment, the $R^1$ group contains 1 to 10 carbon atoms, for example 1 to 6 carbon atoms. In another embodiment, the $R^1$ group contains 10 or more carbon atoms, for example 10 to 24 carbon atoms.

$R^1$ may be an alkyl group (in other words, a group containing carbon and hydrogen). The alkyl group may be completely saturated or may contain unsaturated groups (i.e., may contain alkene and alkyne functional groups, so the term "alkyl" encompasses the terms "alkylene" and "alkylene" within its scope). The alkyl group may be straight-chained or branched.

The alkyl group may be unsubstituted (i.e., the alkyl group contains only carbon and hydrogen). The unsubstituted alkyl group may be unsaturated or saturated. Examples of possible saturated unsubstituted alkyl groups include methyl, ethyl, n-propyl, sec-propyl, cyclopropyl, n-butyl, sec-butyl, tert-butyl, cyclobutyl, pentyl (branched or unbranched), hexyl (branched or unbranched), heptyl (branched or unbranched), octyl (branched or unbranched), nonyl (branched or unbranched), and decyl (branched or unbranched). Saturated unsubstituted alkyl groups having a greater number of carbons may also be used. Cyclic alkyl groups may also be used, so the alkyl group may comprise, for example, a cyclopropyl group, a cyclcobutyl group, a cyclopentyl group, a cyclohexyl group, a cycloheptyl group, a cyclooctyl group, a cyclcononyl group and/or a cyclodecyl group. These cyclic alkyl groups may directly append the amidoxime group or may be joined to the amidoxime through one or more carbon atoms.

Embodiments further include alkyl groups appending two or more amidoxime functional groups. For example, the amidoxime may be:

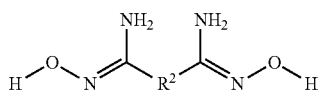

where $R^2$ is a linking alkyl or aryl group. For example, $R^2$ may be a straight chained alkyl group, such as an unsubstituted straight chained alkyl group. Examples of suitable groups include methylene, ethylene, propylene, butylene, pentylene, hexylene, heptylene, octylene, nonylene and decylene.

If the alkyl group is unsaturated, it may be any of the alkyl groups previously listed except for having one or more unsaturated carbon-carbon bonds (so it may contain one or more alkene and/or alkyne groups). These unsaturated group(s) may optionally be in conjugation with the amidoxime group.

The alkyl group may also be substituted with one or more hetero-atoms or group of hetero-atoms. If more than one hetero-substituent is present, the substituents are independently selected from one another unless they form a part of a particular functional group (e.g., an amide group). Groups containing hetero-atoms joined to carbon atoms are contained within the scope of the term "heteroalkyl" as discussed below. In one embodiment, the substituent is an oxime group (=NOH). The alkyl group may also be itself substituted with one or more amidoxime functional groups.

If the alkyl group is substituted with oxygen atom containing functional groups, the alkyl group may comprise an aldehyde, a ketone, a carboxylic acid or an amide. Preferably, there is an enolizable hydrogen adjacent to the =O, =NH or =NOH (i.e. there is a hydrogen in the alpha position to the carbonyl). The alkyl group may comprise the following functionality: —(CZ$^1$)—CH—(CZ$^2$)—, wherein $Z^1$ and $Z^2$ are independently selected from O, NH and NOH. The CH in this group is further substituted with hydrogen or an alkyl group or joined to the amidoxime functional group.

The term heteroalkyl also includes within its scope cyclic alkyl groups containing a heteroatom. If $Z^1$ or $Z^2$ is N, NH, NOH or O, examples of such groups include a lactone, lactam or lactim. Further examples of heteroalkyl groups include azetidines, oxetane, thietane, dithietane, dihydrofuran, tetrahydrofuran, dihydrothiophene, tetrahydrothiophene, piperidine, pyrroline, pyrrolidine, tetrahydropyran, dihydropyran, thiane, piperazine, oxazine, dithiane, dioxane and morpholine. These cyclic groups may be directly joined to the amidoxime group or may be joined to the amidoxime group through an alkyl group.

The heteroalkyl group may be unsubstituted or substituted with one or more hetero-atoms or group of hetero-atoms or itself be substituted with another heteroalkyl group. If more than one hetero-substituent is present, the substituents are independently selected from one another unless they form a part of a particular functional group (e.g., an amide group). The heteroalkyl group may also be itself substituted with one or more amidoxime functional groups.

If the heteroalkyl group is substituted with oxygen containing functional groups, the heteroalkyl group may comprise an aldehyde, a ketone, a carboxylic acid or an amide. Preferably, there is an enolizable hydrogen adjacent to the =O, =NH or =NOH (i.e. there is a hydrogen in the alpha position to the carbonyl). The heteroalkyl group may comprise the following functionality: —(CZ$^1$)—CH—(CZ$^2$)—, wherein $Z^1$ and $Z^2$ are independently selected from O, NH and NOH. The CH in this group is further substituted with hydrogen or an alkyl group or heteroalkyl group or joined to the amidoxime functional group.

Amines are particularly versatile functional groups for use in the present invention, in part because of their ease of preparation. For example, by using acrylonitrile as described later, a variety of functionalized amines can be synthesized.

$R^2$ may itself be an alkyl group or a heteroatom or group of heteroatoms. The heteroatoms may be unsubstituted or substituted with one or more alkyl groups.

$R^2$ may be an aryl group. The term "aryl" refers to a group comprising an aromatic cycle. The cycle is made from carbon atoms. The cycle itself may contain any number of atoms, for example 3 to 10 atoms. For the sake of convenient synthesis, cycles comprising 5 or 6 atoms have been found to be particularly useful. An example of an aryl substituent is a phenyl group.

The aryl group may be unsubstituted. The aryl group may also be substituted with one or more alkyl groups, heteroalkyl groups, or hetero-atom substituents. If more than one substituent is present, the substituents are independently selected from one another.

In one embodiment, the substituent is an oxime group (=NOH). The one or more alkyl groups are the alkyl groups defined previously and the one or more heteroalkyl groups are the heteroalkyl groups defined previously.

$R^2$ may also be hetero-aryl. The term hetero-aryl refers to an aryl group containing one or more hetero-atoms in its aromatic cycle.

The hetero-aryl group may be unsubstituted. The heteroaryl group may also be substituted.

Within the scope of the term aryl are alkyl-aryl groups. The term "alkyl-aryl" refers to an amidoxime group bearing (i.e., directly joined to) an alkyl group. The alkyl group is then itself substituted with an aryl group. Correspondingly, within the scope of the term heteroaryl are alkyl-heteroaryl groups.

The alkyl group may be any alkyl group previously defined. The aryl/heteroaryl group may also be any aryl group previously defined.

Both the alkyl group and the aryl/heteroalkyl group may be unsubstituted.

Alternatively, one or both of the alkyl group and the aryl/heteroalkyl group may be substituted. If the alkyl group is substituted, it may be substituted with one or more hetero-atoms or groups containing hetero-atoms. If the aryl/heteroalkyl group is substituted, it may be substituted with one or more alkyl groups, heteroalkyl groups or hetero-atom substituents. If more than one substituent is present, the substituents are independently selected from one another.

The heteroalkyl group may be any alkyl group previously defined. The aryl/heteroaryl group may also be any aryl group previously defined.

Both the heteroalkyl group and the aryl/heteroaryl group may be unsubstituted. Alternatively, one or both of the heteroalkyl group and the aryl/heteroaryl group may be substituted. If the heteroalkyl group is substituted, it may be substituted with one or more hetero-atoms or groups containing hetero-atoms. If the aryl/heteroaryl group is substituted, it may be substituted with one or more alkyl groups, heteroalkyl groups or hetero-atom substituents. If more than one substituent is present, the substituents are independently selected from one another.

If the heteroalkyl group is substituted with oxygen containing functional groups, the heteroalkyl group may comprise an aldehyde, a ketone, a carboxylic acid or an amide. Preferably, there is an enolizable hydrogen adjacent to the =O, =NH or =NOH (i.e., there is a hydrogen in the alpha position to the carbonyl). The heteroalkyl group may comprise the following functionality: —(CZ$^1$)—CH—(CZ$^2$)—, wherein Z$^1$ and Z$^2$ are independently selected from O, NH and NOH. The CH in this group is further substituted with hydrogen or an alkyl group or heteroalkyl group or joined to the amidoxime functional group.

In one embodiment, the present invention provides an amidoxime molecule that contains at least two amidoxime functional groups. In another embodiment, the present invention provides an amidoxime molecule containing multiple amidoxime functional groups. In fact, a large number of functional groups can be contained in a single molecule, for example if a polymer has repeating units having appending amidoxime functional groups. Examples of amidoxime compounds that contain more than one amidoxime functional group have been described previously throughout the specification.

Amidoximes may be conveniently prepared from nitrile-containing molecules.

Typically, hydroxylamine or substituted hydroxylamine derivatives are used. Accordingly, amidoxime molecules containing more than one amidoxime functional groups can be conveniently prepared from precursors having more than one nitrile group.

One preferred method of forming the nitrile precursors to the amidoximes of the present invention is by nucleophilic substitution of a leaving group with a nucleophile.

It has been found that one reaction is particularly versatile for producing nitrile precursors for amidoxime compounds:

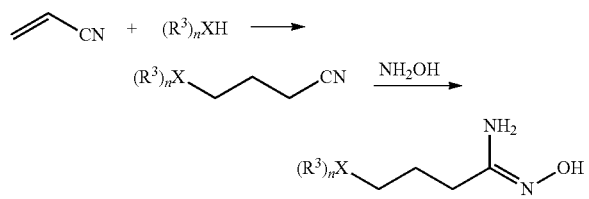

In this example, X bears n number of independently-selected substituents. Each R$^3$ is independently chosen from hydrogen, alkyl, heteroalkyl, aryl, heteroaryl and alkylaryl as previously defined. X is a nucleophilic atom as previously defined. For XH=CH—, wherein a stabilized anion may be formed. XH may be selected from, but not limited to, —CHCO—R$^4$, —CHCOOH, —CHCN, —CHCO—OR$^4$, —CHCO—NR$^4$R$^5$, —CHCNH—R$^4$, —CHCNH—OR$^4$, —CHCNH—NR$^4$R$^5$, —CHCNOH—R$^4$, —CHCNOH—OR$^4$ and —CHCNOH—NR$^4$R$^5$, wherein R$^4$ and R$^5$ are independently chosen from hydrogen, alkyl, heteroalkyl, aryl, heteroaryl and alkylaryl as previously defined.

The acrylonitrile may be substituted as desired. For example, the acrylonitrile may have the following formula:

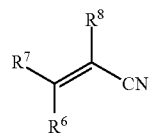

wherein R$^6$, R$^7$ and R$^8$ are independently selected from hydrogen, heteteroatoms atoms or groups that are not carbon or hydrogen), heterogroups, alkyl, heteroalkyl, aryl and heteroaryl.

For example, process step (a), referred to above in the Summary of the Invention, may be carried out in the presence of a cyanoethylation catalyst. This catalyst may be a base but is not limited to a base. Typically, catalysts used in cyanoethylation reactions comprise metal ions. However, the process can be adapted to produce an amidoxime for a semiconductor processing composition by, for example, using a cyanoethylation catalyst that is substantially free from metal ions. Suitable cyanoethylation catalysts include ammonium hydroxide and organic derivatives thereof (i.e., where one or more of the hydrogens on the ammonium cation is independently substituted with one or more groups as previously defined). For example, the catalyst may be selected from the group consisting of benzyltrimethylammonium hydroxide, dimethyldiethylammonium hydroxide, tetrabutylammonium hydroxide, tetraethylammonium hydroxide, tetramethylammonium hydroxide, tetramethylammonium hydroxide pentahydrate, tetrapropylammonium hydroxide, trimethylbenzylammonium hydroxide (Triton B), or 'tris(2-hydroxyethyl)methylammonium hydroxide (THEMAH)'.

To take a different aspect, hydroxylamine may be used to convert the cyanoethylation product into an amidoxime. In non-semiconductor applications, this hydroxylamine is typically produced in situ because hydroxylamine itself is considered explosive. This in situ manufacture typically comprises, for example, the deprotection of [NH$_3$(OH)]Cl with a base comprising a metal ion such as sodium or potassium tert-butoxide, sodium hydroxide or tetramethylammonium hydroxide which affords a sodium-free salt byproduct. It is desirable to produce semiconductor processing compositions that are free of metal ions such as sodium. In order to produce an amidoxime that is substantially free from metal ions, preferably no reagents that comprise metal ions (apart from as unavoidable impurities) are used. Thus, either the hydroxylamine is provided in its deprotected form or it is generated in situ without using a reagent that comprises metal ions. Preferably, the hydroxylamine is provided as hydroxylamine free base.

This cyanoethylation reaction is particularly versatile, especially when applied to the synthesis of multidentate amidoxime compounds (i.e., molecules containing two or more amidoxime functional groups). In some embodiments, the nucleophile may have an oxygen or nitrogen centre. In other words, after the nucleophilic reaction, the nucleophile is connected to the acrylonitrile through oxygen or nitrogen. In other embodiments, the nucleophile is, for example but without limitation, carbon centered, phosphorus centered or sulphur centered.

In one example, the cyanoethylation reaction can be used to functionalize a molecule containing two primary amines or a diamine with 4.0 equivalents of acrylonitrile to prepare a tetranitrile precursor to a tetraamidoxime. For example:

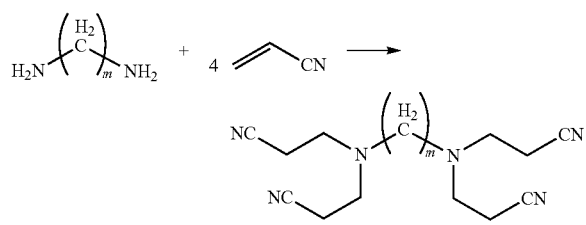

where m is 1 or more, for example 1 to 24 and represents a alkyl linking group between amino groups. The dinitrile could also be prepared using 2.0 equivalents of acrylonitrile and the trinitrile prepared using 3.0 equivalents of acrylonitrile.

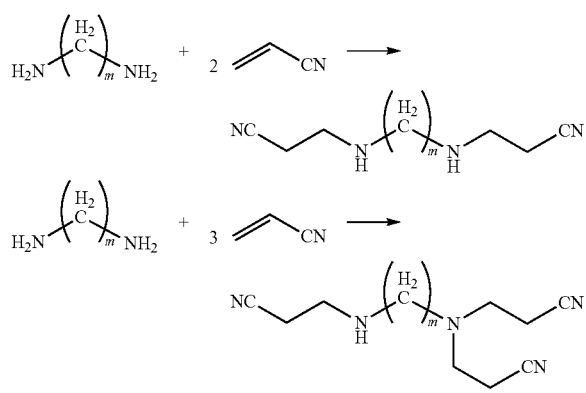

The nitriles and mixtures thereof are useful in preparing compounds that posses multiple amidoxime groups.

Diamines that are linked through $R^9$ can also provide polynitirile precursors to amidoximes:

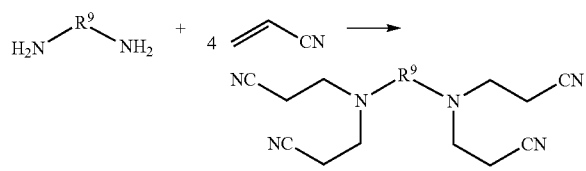

wherein $R^9$ is substituted alkyl, heteroalkyl, aryl or heteroaryl. In an alternative conceived embodiment, $R^9$ is nothing: the starting material is hydrazine. An example of this reaction where $R^9$ is $CH_2CH_2$ is provided in the examples.

For example, polyalcohol (polyol) or polyhydroxy compounds may be functionalized by cyanoethylation with acrylonitrile to prepare polynitrile precursors for molecules that posses multiple amidoxime groups. Poly-alcohols are molecules that contain more than one alcohol functional group. As an example, the following is a polyalcohol:

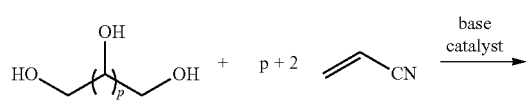

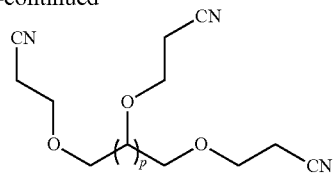

wherein p is 0 or more, for example 0 to 24. In one example, p is 0 (ethylene glycol). In another example, n is 4 (sorbitol).

In another example, the polyalcohol forms part of a polymer. For example, reaction may be carried out with a polymer comprising polyethylene oxide. For example, the polymer may contain just ethylene oxide units, or may comprise polyethylene oxide units as a copolymer (i.e., with one or more other monomer units). For example, the polymer may be a block copolymer comprising polyethylene oxide. For copolymers, especially block copolymers, the polymer may comprise a monomer unit not containing alcohol units. For example, the polymer may comprise blocks of polyethylene glycol (PEG). Copolymer (e.g., block copolymers) of polyethylene oxide and polyethylene glycol may be advantageous because the surfactant properties of the blocks of polyethylene glycol can be used and controlled.

Dihydyoxy compounds that are linked through $R^{10}$ can also provide polynitrile precursors to amidoximes:

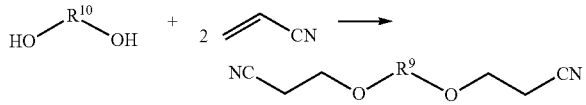

wherein $R^{10}$ is substituted alkyl, heteroalkyl, aryl or heteroaryl.

Carbon nucleophiles can also be used. Many carbon nucleophiles are known in the art. For example, an enol group can act as a nucleophile. Harder carbon-based nucleophiles can be generated by deprotonation of a carbon. While many carbons bearing a proton can be deprotonated if a strong enough base is provided, it is often more convenient to be able to use a weak base to generate a carbon nucleophile, for example NaOEt or LDA. As a result, in one embodiment, a CH group having a $pK_a$ of 20 or less, for example, 15 or less, is deprotonated to form the carbon-based nucleophile An example of a suitable carbon-based nucleophile is a molecule having the b-dicarbonyl functionality selected from the group of aldehydes, esters, amides, imines, oximes where X and Y are heteroatoms such as oxygen, sulfur or nitrogen-containing groups such as NH or NOH. For example:

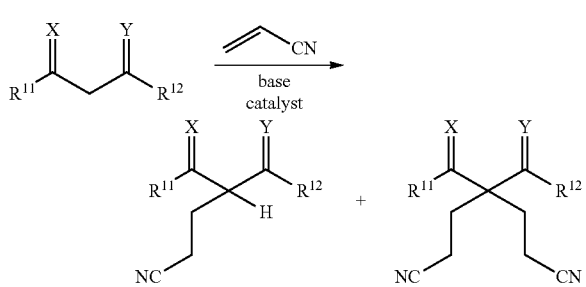

where $R^{11}$ and $R^{12}$ are independently selected alkyl groups, heteroalkyl groups, aryl groups, heteroaryl groups and heteroatoms and X and Y are independently selected heteroatoms such as oxygen, sulfur or nitrogen-containing groups such as NH or NOH.

Nitrile groups have lower the p$K_a$ of hydrogens in the alpha position. This in fact means that sometimes control of reaction conditions is preferably used to prevent a cyano compound, once formed by reaction of a nucleophile with acrylonitrile, from deprotonating at its alpha position and reacting with a second acrylonitrile group. For example, selection of base and reaction conditions (e.g. temperature) can be used to prevent this secondary reaction. However, this observation can be taken advantage of to functionalize molecules that already contain one or more nitrile functionalities. For example, the following reaction occurs in basic conditions:

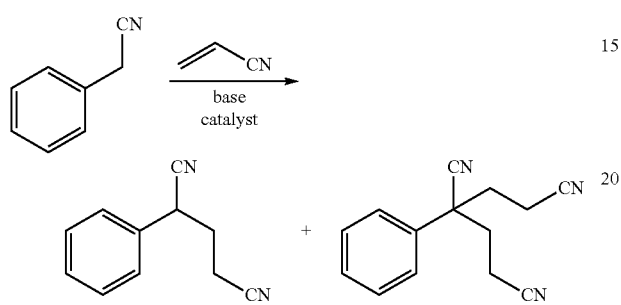

This example takes advantage of the acidic nature of the methylene protons alpha-to the nitrile group that are also benzyllic.

The cyanoethylation process usually requires a strong base as a catalyst. The use of a base catalyst comprising a metal is not preferred, for example the use of an alkali metal hydroxide, such as, e.g., sodium oxide, lithium hydroxide, sodium hydroxide and potassium hydroxide. This is because these metals, in turn, can exist as impurities in the amidoxime compound solution. The existence of such metals in the amidoxime compound solution is not acceptable for use in electronic, and more specifically, semiconductor manufacturing processes and as stabilizer for hydroxylamine freebase and other radical sensitive reaction chemicals.

Preferably, alkali bases are metal ion-free organic ammonium hydroxide compound, such as tetramethylammonium hydroxide, trimethylbenzylammonium hydroxide and the like. In this context, the term "organic" means that one or more of the protons in the $NH_4$ cation has been replaced by an organic group such independently-selected alkyl, heteroalkyl, aryl and heteroaryl.

Preferably, the hydroxylamine used in the synthesis of the amidoxime is hydroxylamine freebase. Preferably, hydroxylamine generated in-situ by reacting hydroxylamine sulfate with sodium hydroxide is not used because this can result in unacceptable contamination of the amidoxime by metal ions.

One particular class of compounds that can be produced using the above advantageous cyanoethylation methodology is:

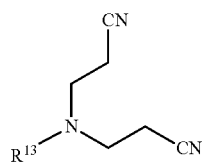

or substituted versions thereof (for example synthesized using a substituted acrylonitrile), wherein $R^{13}$ an aryl or heteroaryl group having an aromatic group in conjugation with the tertiary nitrogen. These compounds may be synthesized from the corresponding compounds having a free —$NH_2$ and reacting with an unsubstituted or substituted acrylonitrile.

In particular, $R^{13}$ may comprise a substituted or unsubstituted six-membered heteroaryl group directly joined to the nitrogen (i.e. therefore having an aniline core or the corresponding heteroaryl version thereof). For example, $R_a$ may be a substituted or unsubstituted phenyl, pyridyl, pyridyl N-oxide or furan group. This produces the following class of oximes:

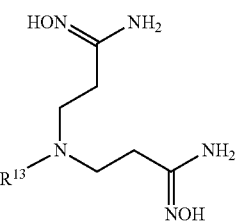

or substituted versions thereof (for example synthesized using a substituted acrylonitrile).

For example, the following two compounds fall within the scope of the above class of compounds:

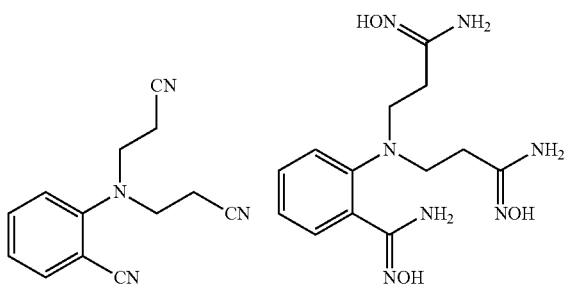

or substituted versions thereof (for example synthesized using a substituted acrylonitrile). This class of compounds is a particular versatile example of the more general class of multidentate amidoxime compounds that fall within the scope of the present invention.

Other Components of the Semiconductor Processing Compositions

For the avoidance of doubt, the following description is applicable to any of the embodiments described above. Amidoxime compounds according to the present invention may be formulated for use in cleaning compositions for removal of residues and contaminants, such as polymers, metal oxides, organics and organometallics, and/or metallics, etc. from a semiconductor substrate. As the industry develops processes for 65 nm and 45 nm technology nodes, post etch/ash cleaning faces new challenges with surface cleanliness and material loss. The introduction and integration of new materials, such as metal hard mask, creates additional requirements for wafer cleaning due to occurrence of new defect modes related to metal hard mask. Hard mask for dual damascene interconnect processing have primarily been dielectric films, such as films comprising SiN, SiC and SiON. More recently, with the introduction of porous low-k films, the industry trend is to use metal hard masks, typically titanium, aluminum, tantalum, or alloys such as titanium nitride (TiN), titanium oxynitride (TiON), tantalum nitride (TaN), alumina ($Al_2O_3$), silicon oxynitride (SiON), and silicon carbonitride (SiCN). In the dual damascene Cu/low-k process flow with hard mask, there are three typical residues remaining after etch/ash: generic polymer residue, organometallic residue strongly bonded to a metal mask, and time-dependent metal fluoride residue.

Amidoxime compounds according to the invention may also be formulated for use in chemical mechanical polishing (CMP) of metal substrates on semiconductor wafers. Such CMP slurry compositions are characterized to enhance removal of barrier layer materials, copper, and low-k dielectric materials in relation to PETEOS dielectric layer materials, and can provide tenability for selective removal of barrier layer materials.

Amidoxime compounds according to the invention may also be formulated as a aqueous solution for selective removal of chemical residues from metal or dielectric substrates or for chemical mechanical polishing of a copper or aluminum surface. The goal of the cleaning process ("Post CMP cleaning") is to remove residues left after the CMP step from a substrate without significantly etching metal, leaving deposits on the surface, or imparting significant organic (such as carbon) contamination to the substrate. It is also desirable to protect the any metal surface from corrosion by various mechanisms, such as by chemical etching, galvanic corrosion or from photo induced corrosion. Corrosion of the metal surfaces results in formation of metal recesses and thinning of the metal lines. It is highly advantageous to use a cleaning solution to protect the metal surfaces of the semiconductor device from having a high static etch rate and from oxidation of the metal surfaces, such as by forming a protective film on the surface. The metal surfaces of semiconductor device are typically copper and form the conducting paths of the semiconductor wafer. Due to the very small size of features on semiconductor devices, the metal lines are as thin as possible while still carrying the desired electric current. Any oxidation or corrosion on the surface or recess of the metal causes thinning of the lines (dissolution) and can result in poor performance or premature failure of the semiconductor device. Therefore, it is important to employ selective cleaning solutions that operate to protect the metal surfaces from corrosion by forming suitable corrosion resistant film on the surface of the metal. Thus, a semiconductor processing composition according to the instant invention may contain one or more additional components selected from the group consisting of water, solvent, acid, bases, activators, compounds having a redox potential and surfactants, sources of fluoride ions, chelating agents, and abrasives.

Water

Within the scope of this invention, water may be introduced into the composition essentially only in chemically and/or physically bound form or as a constituent of the raw materials or compounds.

Solvent (Which is Not Water)—from about 1% to about 99% by Weight.

The semiconductor processing composition of the present invention also includes 0% to about 99% by weight and more typically about 1% to about 80% by weight of a water miscible organic solvent. In alternate embodiments, compositions of the invention include from about 1% to about 75%, from about 1% to about 65%, from about 1% to about 85%, from about 1% to about 90%, from about 1% to about 95%, from about 1% to about 97% by weight of the water miscible organic solvent.

Examples of water miscible organic solvents include, but are not limited to, dimethylacetamide (DMAC), N-methylpyrrolidinone (NMP), N-Ethyl pyrrolidone (NEP), N-Hydroxyethyl Pyrrolidone (HEP), N-Cyclohexyl Pyrrolidone (CHP) dimethylsulfoxide (DMSO), Sulfolane, dimethylformamide (DMF), N-methylformamide (NMF), formamide, Monoethanol amine (MEA), Diglycolamine, dimethyl-2-piperidone (DMPD), morpholine, N-morpholine-N-Oxide (NMNO), tetrahydrofurfuryl alcohol, cyclohexanol, cyclohexanone, polyethylene glycols and polypropylene glycols, glycerol, glycerol carbonate, triacetin, ethylene glycol, propylene glycol, propylene carbonate, hexylene glycol, ethanol and n-propanol and/or isopropanol, diglycol, propyl or butyl diglycol, hexylene glycol, ethylene glycol methyl ether, ethylene glycol ethyl ether, ethylene glycol propyl ether, ethylene glycol mono-n-butyl ether, diethylene glycol methyl ether, diethylene glycol ethyl ether, propylene glycol methyl, ethyl or propyl ether, dipropylene glycol methyl or ethyl ether, methoxy, ethoxy or butoxy triglycol, 1-butoxyethoxy-2-propanol, 3-methyl-3-methoxybutanol, propylene glycol t-butyl ether, and other amides, alcohols or pyrrolidones, ketones, sulfoxides, or multifunctional compounds, such as hydroxyamides or aminoalcohols, and mixtures of these solvents thereof. The preferred solvents, when employed, are dimethyl acetamide and dimethyl-2-piperidone, dimethylsulfoxide and N-methylpyrrolidinone, diglycolamine, and monoethanolamine.

Acids—from about 0.001% to about 15% by Weight

Possible acids are either inorganic acids or organic acids provided these are compatible with the other ingredients. Inorganic acids include hydrochloric acid, hydrofluoric acid, sulfuric acid, phosphoric acid, phosphorous acid, hypophosphorous acid, phosphonic acid, nitric acid, and the like. Organic acids include monomeric and/or polymeric organic acids from the groups of unbranched saturated or unsaturated monocarboxylic acids, of branched saturated or unsaturated monocarboxylic acids, of saturated and unsaturated dicarboxylic acids, of aromatic mono-, di- and tricarboxylic acids, of sugar acids, of hydroxy acids, of oxo acids, of amino acids and/or of polymeric carboxylic acids are preferred.

From the group of unbranched saturated or unsaturated monocarboxylic acids: methanoic acid (formic acid), ethanoic acid (acetic acid), propanoic acid (propionic acid), pentanoic acid (valeric acid), hexanoic acid (caproic acid), heptanoic acid (enanthic acid), octanoic acid (caprylic acid), nonanoic acid (pelargonic acid), decanoic acid (capric acid), undecanoic acid, dodecanoic acid (lauric acid), tridecanoic acid, tetradecanoic acid (myristic acid), pentadecanoic acid, hexadecanoic acid (palmitic acid), heptadecanoic acid (margaric acid), octadecanoic acid (stearic acid), eicosanoic acid (arachidic acid), docosanoic acid (behenic acid), tetracosanoic acid (lignoceric acid), hexacosanoic acid (cerotic acid), triacontanoic acid (melissic acid), 9c-hexadecenoic acid (palmitoleic acid), 6c-octadecenoic acid (petroselic acid), 6t-octadecenoic acid (petroselaidic acid), 9c-octadecenoic acid (oleic acid), 9t-octadecenoic acid (elaidic acid), 9c,12c-octadecadienoic acid (linoleic acid), 9t,12t-octadecadienoic acid (linolaidic acid) and 9c,12c,15c-octadecatrienoic acid (linolenic acid).

From the group of branched saturated or unsaturated monocarboxylic acids: 2-methylpentanoic acid, 2-ethylhexanoic acid, 2-propylheptanoic acid, 2-butyloctanoic acid, 2-pentylnonanoic acid, 2-hexyldecanoic acid, 2-heptylundecanoic acid, 2-octyldodecanoic acid, 2-nonyltridecanoic acid, 2-decyltetradecanoic acid, 2-undecylpentadecanoic acid, 2-dodecylhexadecanoic acid, 2-tridecylheptadecanoic acid, 2-tetradecyloctadecanoic acid, 2-pentadecylnonadecanoic acid, 2-hexadecyleicosanoic acid, 2-heptadecylheneicosanoic acid.

From the group of unbranched saturated or unsaturated di- or tricarboxylic acids: propanedioic acid (malonic acid), butanedioic acid (succinic acid), pentanedioic acid (glutaric acid), hexanedioic acid (adipic acid), heptanedioic acid (pimelic acid), octanedioic acid (suberic acid), nonanedioic acid (azelaic acid), decanedioic acid (sebacic acid), 2c-butenedioic acid (maleic acid), 2t-butenedioic acid (fumaric acid), 2-butanedicarboxylic acid (acetylenedicarboxylic acid).

From the group of aromatic mono-, di- and tricarboxylic acids: benzoic acid, 2-carboxybenzoic acid (phthalic acid), 3-carboxybenzoic acid (isophthalic acid), 4-carboxybenzoic acid (terephthalic acid), 3,4-dicarboxybenzoic acid (trimellitic acid), and 3,5-dicarboxybenzoic acid (trimesionic acid).

From the group of sugar acids: galactonic acid, mannonic acid, fructonic acid, arabinonic acid, xylonic acid, ribonic acid, 2-deoxyribonic acid, alginic acid.

From the group of hydroxy acids: hydroxyphenylacetic acid (mandelic acid), 2-hydroxypropionic acid (lactic acid), hydroxysuccinic acid (malic acid), 2,3-dihydroxybutanedioic acid (tartaric acid), 2-hydroxy-1,2,3-propanetricarboxylic acid (citric acid), ascorbic acid, 2-hydroxybenzoic acid (salicylic acid), 3,4,5-trihydroxybenzoic acid (gallic acid), and hydroxyacetic acid (glycolic acid).

From the group of oxo acids: 2-oxopropionic acid (pyruvic acid) and 4-oxopentanoic acid (levulinic acid).

From the group of amino acids: alanine, valine, leucine, isoleucine, proline, tryptophan, phenylalanine, methionine, glycine, serine, tyrosine, threonine, cysteine, asparagine, glutamine, aspartic acid, glutamic acid, lysine, arginine, and histidine.

In one embodiment of the invention, the semiconductor processing composition contains from about 0.001% to about 15% by weight, alternatively from about 1% to about 10%, alternatively from about 0.1% to about 15%, alternatively from about 0.01% to about 12.5%, alternatively from about 0.001% to about 5% by weight of acid(s).

Bases—From about 1% to about 45% by Weight

Possible bases are either inorganic bases or organic bases provided these are compatible with the other ingredients. Inorganic bases include sodium hydroxide, lithium hydroxide, potassium hydroxide, ammonium hydroxide and the like. Organic bases including organic amines, and quaternary alkylammonium hydroxide which may include, but are not limited to, tetramethylammonium hydroxide (TMAH), TMAH pentahydrate, benzyltetramethylammonium hydroxide (BTMAH), tetrabutylammonium hydroxide (TBAH), choline, and Tris(2-hydroxyethyl)methylammonium hydroxide (THEMAH).

In one embodiment, the semiconductor processing composition contains from about 1% to about 45%, alternatively from about 1% to about 15%, alternatively from about 1% to about 20%, alternatively from about 1% to about 30%, alternatively from about 1% to about 35%, alternatively from about 1% to about 40% by weight of base(s).

Activator—From about 0.001% to about 25% by Weight

According to the present invention, the semiconductor processing compositions comprise one or more substances from the group of activators, in particular from the groups of polyacylated alkylenediamines, in particular tetraacetylethylenediamine (TAED), N-acylimides, in particular N-nonanoylsuccinimide (NOSI), acylated phenolsulfonates, in particular n-nonanoyl- or isononanoyloxybenzenesulfonate (n- or iso-NOBS) and n-methylmorpholiniumacetonitrile, methylsulfate (MMA), and "nitrile quaternary" compound in amounts of from 0.1 to 20% by weight, preferably from 0.5 to 15% by weight and in particular from 1 to 10% by weight, in each case based on the total composition to enhance the oxidation/reduction performance of the cleaning solutions.

A semiconductor processing composition according may optionally contain from about 0.001% to about 25% by weight, alternatively from about 1% to about 10%, alternatively from about 0.1% to about 15%, alternatively from about 0.01% to about 20%, alternatively from about 0.001% to about 5% by weight of an activator.

Compounds Having Oxidation and Reduction Potential—from about 0.001% to about 25% by Weight These compounds include hydroxylamine and its salts, such as hydroxylamine chloride, hydroxylamine nitrate, hydroxylamine sulfate, hydroxylamine phosphate or its derivatives, such as N,N-diethylhydroxylamine, N-Phenylhydroxylamine, Hydrazine and its derivatives; hydrogen peroxide; persulfate salts of ammonium, potassium and sodium, permanganate salt of potassium, sodium; and other sources of peroxide are selected from the group consisting of: perborate monohydrate, perborate tetrahydrate, percarbonate, salts thereof, and combinations thereof. For environmental reasons, hydroxylamine phosphate is not preferred.

Other compounds which may be used as ingredients within the scope of the present invention are the diacyl peroxides, such as, for example, dibenzoyl peroxide. Further typical organic compounds which have oxidation/reduction potentials are the peroxy acids, particular examples being the alkyl peroxy acids and the aryl peroxy acids. Preferred representatives are (a) peroxybenzoic acid and its ring substituted derivatives, such as alkylperoxybenzoic acids, but also peroxy-a-naphthoic acid and magnesium monoperphthalate, (b) the aliphatic or substituted aliphatic peroxy acids, such as peroxylauric acid, peroxystearic acid, c-phthalimidoperoxycaproic acid [phthaloiminoperoxyhexanoic acid (PAP)], o-carboxybenzamidoperoxycaproic acid, N-nonenylamidoperadipic acid and N-nonenylamidopersuccinate, and (c) aliphatic and araliphatic peroxydicarboxylic acids, such as 1,2-diperoxycarboxylic acid, 1,9-diperoxyazelaic acid, diperoxysebacic acid, diperoxybrassylic acid, the diperoxyphthalic acids, 2-decyldiperoxybutane-1,4-dioic acid, N,N-terephthaloyldi(6-aminopercaproic acid) may be used.

The semiconductor processing composition according may optionally contain from about 0.001% to about 25% by weight, alternatively from about 1% to about 10%, alternatively from about 0.1% to about 15%, alternatively from about 0.01% to about 20%, alternatively from about 0.001% to about 5% by weight of compounds having oxidation and reduction potential.

Other Chelating Agents

Preferably, the semiconductor processing composition additionally comprises (by weight of the composition) from about 0.0% to about 15% by weight of one or more chelants. In one embodiment, the semiconductor composition comprises from about 0.001% to about 15%, alternatively from about 0.01% to about 10%, alternatively from about 0.1% to about 5% by weight of one or more chelants.

A further possible group of ingredients are the chelate complexing agents. Chelate complexing agents are substances which form cyclic compounds with metal ions, where a single ligand occupies more than one coordination site on a central atom, i.e., is at least "bidentate". In this case, stretched compounds are thus normally closed by complex formation via an ion to give rings. The number of bonded ligands depends on the coordination number of the central ion. Complexing groups (ligands) of customary complex forming polymers are iminodiacetic acid, hydroxyquinoline, thiourea, guanidine, dithiocarbamate, hydroxamic acid, amidoxime, amidophosphoric acid, (cycl.) polyamino, mercapto, 1,3-dicarbonyl and crown ether radicals, some of which have very specific activities toward ions of different metals.

For the purposes of the present invention, it is possible to use complexing agents of the prior art. These may belong to different chemical groups. Preferred chelating/complexing agents include the following, individually or in a mixture with one another:
1) polycarboxylic acids in which the sum of the carboxyl and optionally hydroxyl groups is at least 5, such as gluconic acid;
2) nitrogen-containing mono- or polycarboxylic acids, such as e.g. ethylenediaminetetraacetic acid (EDTA), N-hydroxyethylethylenediaminetriacetic acid, diethylenetriaminepentaacetic acid, hydroxy-methyliminodiacetic acid, nitridodiacetic acid-3-propionic acid, isoserinediacetic acid, N,N-di(β-hydroxyethyl)glycine, N-(1,2-dicarboxy-2-hydroxyethyl)glycine, N-(1,2-dicarboxy-2-hydroxyethyl)-aspartic acid or nitrilotriacetic acid (NTA);
3) geminal diphosphonic acids, such as e.g. 1-hydroxyethane-1,1-diphosphonic acid (HEDP), higher homologs thereof having up to 8 carbon atoms, and hydroxy or amino group-containing derivatives thereof and 1-aminoethane-1,1-diphosphonic acid, higher homologs thereof having up to 8 carbon atoms, and hydroxy or amino group-containing derivatives thereof;
4) aminophosphonic acids, such as ethylenediamine-tetra (methylenephosphonic acid), diethylenetriaminepenta (methylenephosphonic acid) or nitrilotri (methylenephosphonic acid);
5) phosphonopolycarboxylic acids, such as 2-phosphonobutane-1,2,4-tricarboxylic acid; and
6) cyclodextrins.

Surfactants—from about 10 ppm to about 5% by Weight

The compositions according to the invention may thus also comprise anionic, cationic, and/or amphoteric surfactants as surfactant component. The compositions may comprise from about 10 ppm to about 5%, alternatively from about 10 ppm to about 100 ppm, alternatively from about 0.001% to about 5%, alternatively from about 0.01% to about 2.5%, alternatively from about 0.1% to about 1% by weight of one or more anionic, cationic, and/or amphoteric surfactants.

Source of Fluoride Ions—from an Amount about 0.001% to 10% by Weight

Sources of fluoride ions include, but are not limited to, ammonium bifluoride, ammonium fluoride, hydrofluoric acid, sodium hexafluorosilicate, fluorosilicic acid, and tetrafluoroboric acid.

The semiconductor processing composition may optionally contain from about 0.001% to about 10% by weight, alternatively from about 1% to about 10%, alternatively from about 0.1% to about 10%, alternatively from about 0.01% to about 1%, alternatively from about 0.001% to about 5% by weight of a source of fluoride ion.

Abrasives

The composition of the present invention may also comprise abrasives for use in Chemical Mechanical Planarization. Abrasives are well known to the person skilled in the art. Exemplary abrasives include, but are not limited to, silica and alumina.

The components of the claimed compositions can be metered and mixed in situ just prior dispensing to the substrate surface for treatment. Furthermore, analytical devices can be installed to monitor the composition and chemical ingredients can be re-constituted to mixture to the specification to deliver the cleaning performance. Critical parameters that can be monitored include physical and chemical properties of the composition, such as pH, water concentration, oxidation/reduction potential and solvent components.

Exemplary Amidoxime Compounds

While amidoxime compounds have been referred to previously as chelating agents, it will be understood by the person skilled in the art that they may perform several different functions. For example, they may be surfactants, corrosion inhibitors, radical inhibitors, or surface passivation agents. For example, if the amidoxime is in conjugation with an aromatic system, the amidoxime may have a low oxidation potential and therefore be suitable for use as a radical inhibitor and/or corrosion inhibitor and/or a surface passivation agent. The person skilled in the art will recognize that the 'gentle' chemistry (e.g., near neutral pH; useful at ambient conditions, etc.) that amidoxime compounds offer can be taken advantage of in many different capacities. In particular, the inventive concept described herein embraces formulations comprising amidoxime molecules, i.e., compounds, for semiconductor processing that have two or more amidoxime functional groups and thereby are able to not only etch titanium nitride, but are also compatible with copper, low-k materials, and can simultaneously remove polymeric residues and other potential surface contaminants from the semiconductor device being processed.

For the avoidance of doubt, the word "may" as used herein indicates the presence of an optional feature. In other words, the word "may" can be substituted with "is preferably" or "is typically".

Generally all known water-soluble amidoxime compounds having two or more amidoxime functional groups can be suitable for use in the composition and process of the present invention. Of particular interest are those amidoxime compounds useful in the semiconductor industry such as, for example, those selected from the examples that follow. These exemplary amidoxime compounds also include a reaction pathway for their synthesis.

In one embodiment of the invention, the amidoxime compound having two or more amidoxime functional groups is selected from the group consisting of 1,2,3,4,5,6-hexakis-O-[3-(hydroxyamino)-3-iminopropyl hexitol; 3,3',''',3'''-(ethane-1,2-diylbis(azanetriyl))tetrakis(N'-hydroxypropanimidamide); 3,3'-(ethane-1,2-diylbis(oxy))bis(N'-hydroxypropanimidamide); 3,3'-(piperazine-1,4-diyl)bis(N'-hydroxypropanimidamide); 3,3',3''-nitrilotris(N'-hydroxypropanimidamide); 3,3'-(2,2-bis((3-(hydroxyamino)-3-iminopropoxy)methyl)propane-1,3-diyl) bis(oxy)bis(N-hydroxypropanimidamide); 3,3'-(2,2'-(methylazanediyl)bis(ethane-2,1-diyl)bis(oxy))bis(N-hydroxypropanimidamide); N,N-bis(3-amino-3-(hydroxyimino)propyl)acetamide; 3,3'-(2-(N'-hydroxycarbamimidoyl)phenylazanediyl)bis(N'-hydroxypropanimidamide); 3,3'-(2,2'-(3-amino-3-(hydroxyimino)propylazanediyl)bis(ethane-2,1-diyl))bis(oxy)bis(N'-hydroxypropanimidamide); 3,3'-azanediylbis(N'-hydroxypropanimidamide); N'1,N'6-dihydroxyadipimidamide; N'1,N'10-dihydroxydecanebis(imidamide); 2,2'-azanediylbis(N'-hydroxyacetimidamide).

Preferred amidoxime compounds include, but are not limited to, those recited in Tables 1 and 2 below.

TABLE 1

Exemplary Preferred Amidoxime Compounds

| | Nitrile (N) | Amidoxime (AO) |
|---|---|---|
| 1 | 3,3'-iminodipropionitrile | 3,3'-azanediylbis(N'-hydroxypropanimidamide) |
| 2 | 2,2'-iminodiacetonitrile | 2,2'-azanediylbis(N'-hydroxyacetimidamide) |

TABLE 2

Exemplary Preferred Amidoxime Compounds

| ID | Nucleophilic compounds | Cyanoethylated Compounds (CE) | Amidoxime from cyanoethylated compounds (AO) |
|---|---|---|---|
| 01 | Sorbitol | 1,2,3,4,5,6-hexakis-O-(2-.kyanoetyl)hexitol | 1,2,3,4,5,6-hexakis-O-[3-(hydroxyamino)-3-iminopropyl hexitol |
| 07 | ethylenediamine | 3,3',3'',3'''-(ethane-1,2-diylbis(azanetriyl))tetrapropanenitrile | 3,3',3'',3'''-(ethane-1,2-diylbis(azanetriyl))tetrakis(N'-hydroxypropanimidamide) |
| 28 | ethylene glycol | 3,3'-(ethane-1,2-diylbis(oxy))dipropanenitrile | 3,3'-(ethane-1,2-diylbis(oxy))bis(N'-hydroxypropanimidamide) |
| 35 | piperazine | 3,3'-(piperazine-1,4-diyl)dipropanenitrile | 3,3'-(piperazine-1,4-diyl)bis(N'-hydroxypropanimidamide) |
| 37 | 2-(2-dimethylamino ethoxy)ethanol | 3-(2-(2-(dimethylamino) ethoxy)ethoxy) propanenitrile | 3-(2-(2-(dimethylamino)ethoxy)ethoxy)-N'-hydroxypropanimidamide |
| 39 | diethyl malonate | diethyl 2,2-bis(2-cyanoethyl) malonate | 2,2-bis(3-amino-3-(hydroxyimino)propyl)malonic acid |
| 41 | ammonia | 3,3',3''-nitrilotri propanenitrile | 3,3',3''-nitrilotris(N'-hydroxypropanimidamide) |
| 42 | diethyl malonate | 2,2-bis(2-cyanoethyl) malonic acid | 2,2-bis(3-amino-3-(hydroxyimino)propyl)malonic acid |
| 43 | glycine (mono cyanoethylated) | 2-(2-cyanoethylamino)acetic acid | 2-(3-amino-3-(hydroxyimino)propylamino)acetic acid |
| 44 | glycine (dicyanothylated) | 2-(bis(2-cyanoethyl)amino) acetic acid | 2-(bis(3-amino-3-(hydroxyimino)propyl)amino)acetic acid |
| 45 | malononitrile | propane-1,1,3-tricarbonitrile | N1,N'1,N'3-trihydroxypropane-1,1,3-tris(carboximidamide) |
| 46 | cyanoacetamide | 2,4-dicyano-2-(2-cyanoethyl)butanamide | 5-amino-2-(3-amino-3-(hydroxyimino)propyl)-2-(N'-hydroxycarbamimidoyl)-5-(hydroxyimino)pentanamide |
| 47 | Pentaerythritol | 3,3'-(2,2-bis((2-cyanoethoxy) methyl) propane-1,3-diyl)bis(oxy) dipropanenitrile | 3,3'-(2,2-bis((3-(hydroxyamino)-3-iminopropoxy)methyl)propane-1,3-diyl)bis(oxy)bis(N-hydroxypropanimidamide) |
| 48 | N-methyl diethanol amine | 3,3'-(2,2'-(methylazanediyl) bis(ethane-2,1-diyl) bis(oxy))dipropanenitrile | 3,3'-(2,2'-(methylazanediyl)bis(ethane-2,1-diyl)bis(oxy))bis(N'-hydroxypropanimidamide) |
| 49 | glycine anhydride | 3,3'-(2,5-dioxopiperazine-1,4-diyl)dipropanenitrile | 3,3'-(2,5-dioxopiperazine-1,4-diyl)bis(N'-hydroxypropanimidamide) |
| 50 | acetamide | N,N-bis(2-cyanoethyl)acetamide | N,N-bis(3-amino-3-(hydroxyimino)propyl)acetamide |
| 51 | anthranilonitrile | 3,3'-(2-cyanophenylazanediyl) dipropanenitrile | 3,3'-(2-(N'-hydroxycarbamimidoyl)phenylazanediyl)bis(N'-hydroxypropanimidamide) |
| 52 | diethanolamine | 3,3'-(2,2'-(2-cyanoethylazanediyl)bis(ethane-2,1-diyl)bis(oxy))dipropane nitrile | 3,3'-(2,2'-(3-amino-3-(hydroxyimino)propylazanediyl)bis(ethane-2,1-diyl))bis(oxy)bis(N'-hydroxypropanimidamide) |

EXAMPLES

Nomenclatures are translated from chemical structures to their corresponding chemical names using ChemBioDraw Ultra from CambridgeSoft, MA. The following abbreviations were used in the examples.

| | |
|---|---|
| Boiling point | Bp |
| Catalytic | Cat |
| Decomposed | Dec |
| Equivalent | eq |
| Ethanol | EtOH |
| Diethyl Ether | $Et_2O$ |
| Ethyl Acetate | EtOAc |
| Ethylenediamine tetraacetic acid | EDTA |
| Gram | g |
| Hydrochloride acid | HCl |
| Isopropyl Alcohol | iPrOH |
| Melting point | Mp |
| Methanol | MeOH |
| Methylene chloride | $CH_2Cl_2$ |
| Millimole or mole | mmol or mol |
| Room temperature | Rt, RT |
| Tetramethylammonium hydroxide (25% in water) | TMAH |
| Trimethylbenzylammonium hydroxide (40% in MeOH) | Triton B |
| 1-Hydroxyethylidene-1,1-diphosphonic acid | HEDP |
| cubic centimeter | $cm^3$ |
| Amino tris(methylene phosphonic acid) | ATMP |
| 3-Methylpyridine-2-amidoxime | MPAO |
| Chemical mechanical polishing | CMP |
| Post-etch residue | PER |
| Scanning electron microscope | SEM |
| Chemical vapor deposition | CVD |
| Liter | lit |
| Fourier transform infrared spectroscopy | FTIR |
| Infrared spectroscopy | IR |
| Nuclear magnetic resonance | NMR |

Synthesis of exemplary amidoxime compounds

Example 1

Reactions to Produce Nitrile Precursors to Amidoxime Compounds

The following reactions are exemplary reactions that produce precursors of amidoxime compounds.

A) Cyanoethylation of piperazine

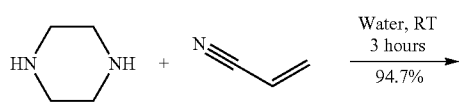

piperazine
Chemical Formula:
$C_4H_{10}N_2$
Molecular Weight:
86.14

Acrylonitrile
Chemical Formula:
$C_3H_3N$
Molecular Weight:
53.06

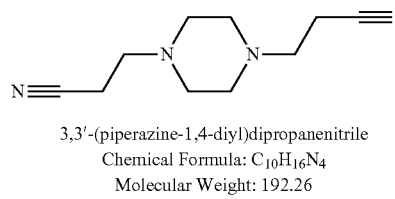

3,3'-(piperazine-1,4-diyl)dipropanenitrile
Chemical Formula: $C_{10}H_{16}N_4$
Molecular Weight: 192.26

A solution of piperazine (1 g, 11.6 mmol) and acrylonitrile (1.6 g, 30.16 mmol, 2.6 eq) in water (10 cm³) were stirred at room temperature for 5 hours, after which the mixture was extracted with dichloromethane (2×50 cm³). The organic extracts were evaporated under reduced pressure to give the pure doubly cyanoethylated compound 3,3'-(piperazine-1,4-diyl)dipropanenitrile (2.14 g, 94.7%) as a white solid, mp 66-67° C.

B) Cyanoethylation of ethylenediamine

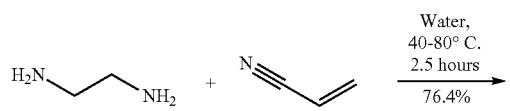

Ethylenediamine
Chemical Formula:
$C_2H_8N_2$
Molecular Weight:
60.10

Acrylonitrile
Chemical Formula:
$C_3H_3N$
Molecular Weight:
53.06

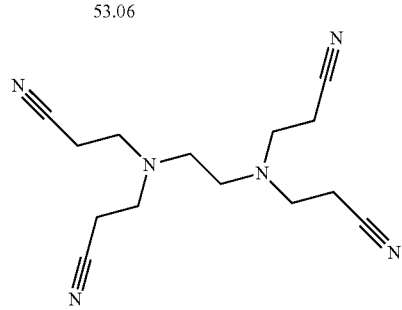

3,3',3'',3'''-(ethane-1,2-diylbis(azanetriyl))-
tetrapropanenitrile
Chemical Formula: $C_{14}H_{20}N_6$
Molecular Weight: 272.35

Acrylonitrile (110 g, 137 cm³, 2.08 mol) was added to a vigorously stirred mixture of ethylenediamine (25 g, 27.8 cm³, 0.416 mol) and water (294 cm³) at 40° C. over 30 min. During the addition, it was necessary to cool the mixture with a 25° C. water bath to maintain temperature at 40° C. The mixture was then stirred for additional 2 hours at 40° C. and 2 hours at 80° C. Excess acrylonitrile and half of the water were evaporated off and the residue, on cooling to room temperature, gave a white solid which was recrystallised from MeOH-water (9:1) to give pure product 3,3',3'',3'''-(ethane-1, 2-diylbis(azanetriyl))tetrapropanenitrile (86.6 g, 76.4%) as white crystals, mp 63-65° C.

C) Cyanoethylation of ethylene glycol

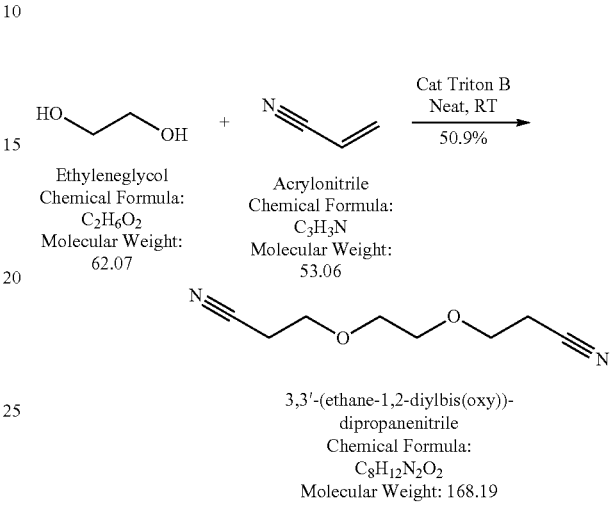

Ethyleneglycol
Chemical Formula:
$C_2H_6O_2$
Molecular Weight:
62.07

Acrylonitrile
Chemical Formula:
$C_3H_3N$
Molecular Weight:
53.06

3,3'-(ethane-1,2-diylbis(oxy))-
dipropanenitrile
Chemical Formula:
$C_8H_{12}N_2O_2$
Molecular Weight: 168.19

Small scale: Ethylene glycol (1 g, 16.1 mmol) was mixed with Triton B (40% in MeOH, 0.22 g, 0.53 mmol) and cooled in an ice-bath while acrylonitrile (1.71 g, 32.2 mmol) was added. The mixture was stirred at room temperature for 60 hours after which it was neutralized with 0.1M HCl (0.6 cm³) and extracted with $CH_2Cl_2$ (80 cm³). The extracts were concentrated under reduced pressure and the residue was Kugelrohr-distilled to give 3,3'-(ethane-1,2-diylbis(oxy))dipropanenitrile (1.08 g, 39.9%) as a light coloured oil, by 150-170° C./20 Torr.

Large scale: Ethylene glycol (32.9 g, 0.53 mol) was mixed with Triton B (40% in MeOH, 2.22 g, 5.3 mmol) and cooled in an ice-bath while acrylonitrile (76.2 g, 1.44 mol) was added. The mixture was allowed to warm slowly to room temperature and stirred for 60 hours after which it was neutralized with 0.1 M HCl (50 cm³) and extracted with $CH_2Cl_2$ (300 cm³). The extracts were passed through a silica plug three times to reduce the brown colouring to give 86 g (quantitative yield) of the product as an amber coloured oil, pure by ¹H-NMR, containing 10 g of water (total weight 96 g, amount of water calculated by ¹H NMR integral sizes).

D) Cyanoethylation of diethyl malonate

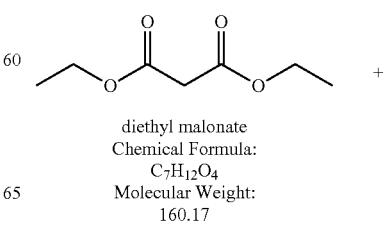

diethyl malonate
Chemical Formula:
$C_7H_{12}O_4$
Molecular Weight:
160.17

-continued

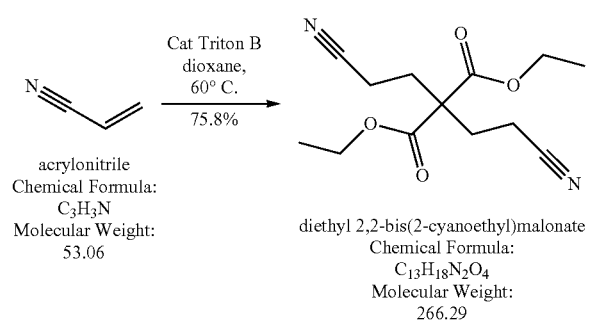

To a solution of diethyl malonate (1 g, 6.2 mmol) and Triton B (40% in MeOH, 0.13 g, 0.31 mmol) in dioxane (1.2 cm³) was added dropwise acrylonitrile (0.658 g, 12.4 mmol) and the mixture was stirred at 60° C. overnight. The mixture was then cooled to room temperature and neutralized with 0.1M HCl (3 cm³) and poured to ice-water (10 cm³). Crystals precipitated during 30 min. These were collected by filtration and recrystallised from EtOH (cooling in freezer before filtering off) to give diethyl 2,2-bis(2-cyanoethyl)malonate (1.25 g, 75.8%) as a white solid, mp 62.2-63.5° C.

E) Hydrolysis of diethyl 2,2-bis(2-cyanoethyl)malonate

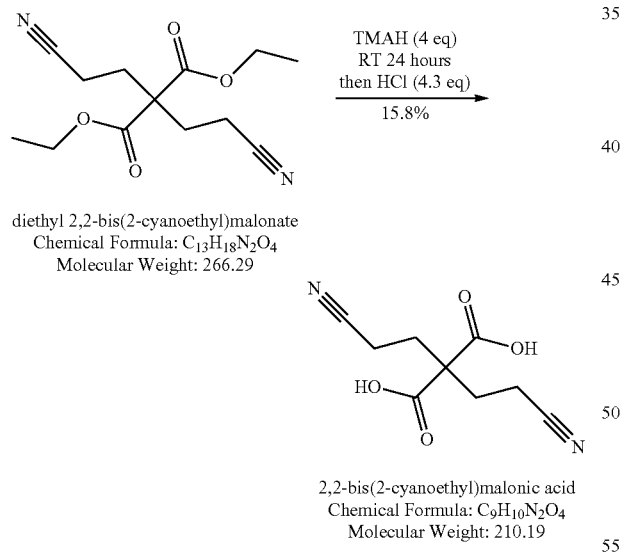

Diethyl 2,2-bis(2-cyanoethyl)malonate (2 g, 7.51 mmol) was added to TMAH (25% in water, 10.95 g, 30.04 mmol) at room temperature. The mixture was stirred for 24 hours, and was then cooled to 0° C. A mixture of 12M HCl (2.69 cm³, 32.1 mmol) and ice (3 g) was added and the mixture was extracted with CH₂Cl₂ (5×50 cm³). The extracts were evaporated under vacuum to give 2,2-bis(2-cyanoethyl)malonic acid (0.25 g, 15.8%) as a colourless very viscous oil (lit decomposed. 158° C.).

F) Dicyanoethylation of glycine to give 2-(bis(2-cyanoethyl)amino)acetic acid

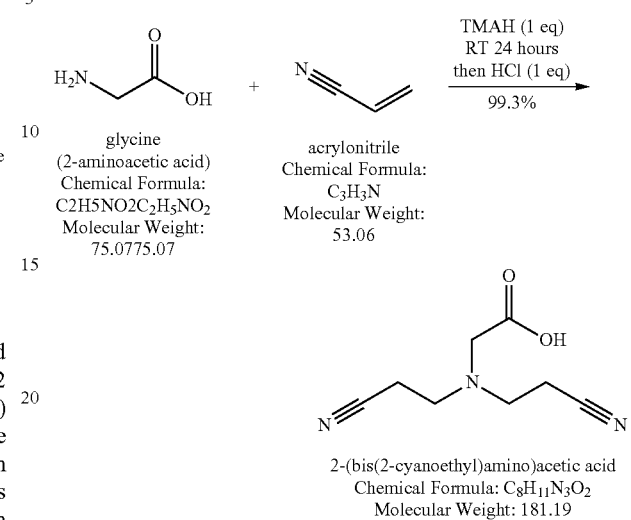

Glycine (5 g, 67 mmol) was suspended in water (10 cm³) and TMAH (25% in water, 24.3 g, 67 mmol) was added slowly, keeping the temperature at <30° C. with an ice-bath. The mixture was then cooled to 10° C. and acrylonitrile (7.78 g, 146 mmol) was added. The mixture was stirred overnight, and allowed to warm to room temperature slowly. It was then heated at 50° C. for 2 hours, using a reflux condenser. After cooling with ice, the mixture was neutralized with HCl (6M, 11.1 cm³) and concentrated to viscous oil. This was dissolved in acetone (100 cm³) and filtered to remove NMe₄Cl. The filtrate was concentrated under reduced pressure to give an oil that was treated once more with acetone (100 cm³) and filtered to remove more NMe₄Cl. Concentration of the filtrate gave 2-(bis(2-cyanoethyl)amino)acetic acid (11.99 g, 99.3%) as a colourless, viscous oil that crystallised over 1 week at room temperature to give a solid product, mp 73° C. (lit mp 77.8-78.8° C. Duplicate $^{13}$C signals indicate a partly zwitterionic form in CDCl₃ solution.

When NaOH is used in the literature procedure, the NaCl formed is easier to remove and only one acetone treatment is necessary.

G) Dicyanoethylation of N-methyldiethanolamine to give 3,3'-(2,2'(methylazanediyl)bis(ethane-2,1-diyl) bis(oxy))dipropanenitrile

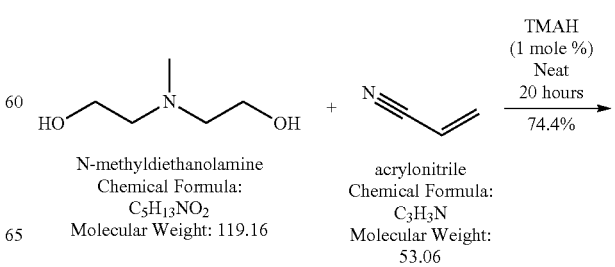

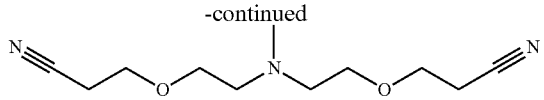

3,3'-(2,2'-(methylazanediyl)bis(ethane-2,1-diyl)-
bis(oxy))-dipropanenitrile
Chemical Formula: $C_{11}H_{19}N_3O_2$
Molecular Weight: 225.29

To a cooled, stirred mixture of N-methyldiethanolamine (2 g, 17 mmol) and acrylonitrile (2.33 g, 42 mmol) was added TMAH (25% in water, 0.25 cm³, 0.254 g, 7 mmol). The mixture was then stirred overnight and allowed to warm to room temperature slowly. It was then filtered through silica using a mixture of $Et_2O$ and $CH_2Cl_2$ (1:1, 250 cm³) and the filtrated was evaporated under reduced pressure to give 3,3'-(2,2'-(methylazanediyl)bis(ethane-2,1-diyl)bis(oxy))dipropanenitrile (2.85 g, 74.4%) as a colourless oil.

H) Dicyanoethylation of glycine anhydride

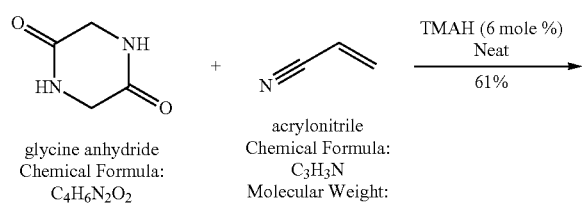

glycine anhydride
Chemical Formula:
$C_4H_6N_2O_2$
Molecular Weight:
114.10 acrylonitrile
Chemical Formula:
$C_3H_3N$
Molecular Weight:
53.06

TMAH (6 mole %)
Neat
61%

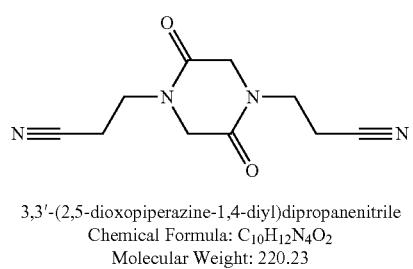

3,3'-(2,5-dioxopiperazine-1,4-diyl)dipropanenitrile
Chemical Formula: $C_{10}H_{12}N_4O_2$
Molecular Weight: 220.23

Glycine anhydride (2 g, 17.5 mmol) was mixed with acrylonitrile (2.015 g, 38 mmol) at 0° C. and TMAH (25% in water, 0.1 cm³, 0.1 g, 2.7 mmol) was added. The mixture was then stirred overnight, allowing it to warm to room temperature slowly. The solid formed was recrystallised from EtOH to give 3,3'-(2,5-dioxopiperazine-1,4-diyl)dipropanenitrile (2.35 g, 61%) as a white solid, mp 171-173° C. (lit mp 166° C.).

I) N,N-Dicyanoethylation of acetamide

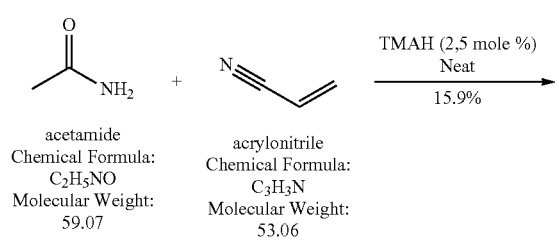

acetamide
Chemical Formula:
$C_2H_5NO$
Molecular Weight:
59.07 acrylonitrile
Chemical Formula:
$C_3H_3N$
Molecular Weight:
53.06

TMAH (2,5 mole %)
Neat
15.9%

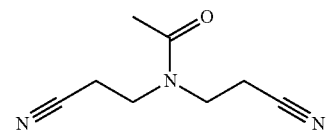

N,N-bis(2-cyanoethyl)acetamide
Chemical Formula: $C_8H_{11}N_3O$
Molecular Weight: 165.19

Acetamide (2 g, 33.9 mmol) was mixed with acrylonitrile (2.26 g, 42.7 mmol) at 0° C. and TMAH (25% in water, 0.06 cm³, 0.06 g, 1.7 mmol) was added. The mixture was then stirred overnight, allowing it to warm to room temperature slowly. The mixture was filtered through a pad of silica with the aid of $Et_2O/CH_2Cl_2$ (200 cm³) and the filtrate was concentrated under reduced pressure. The product was heated with spinning in a Kugelrohr at 150° C./2 mmHg to remove side products and to give N,N-bis(2-cyanoethyl)acetamide (0.89 g, 15.9%) as a viscous oil.

The N-substituent in the amides is non-equivalent due to amide rotation.

J) Tricyanoethylation of ammonia

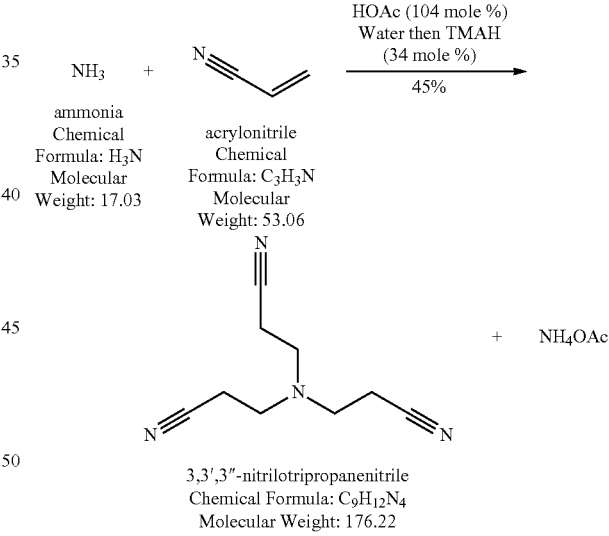

$NH_3$ + ammonia
Chemical
Formula: $H_3N$
Molecular
Weight: 17.03 acrylonitrile
Chemical
Formula: $C_3H_3N$
Molecular
Weight: 53.06

HOAc (104 mole %)
Water then TMAH
(34 mole %)
45%

3,3',3''-nitrilotripropanenitrile
Chemical Formula: $C_9H_{12}N_4$
Molecular Weight: 176.22

+ $NH_4OAc$

Ammonia (aq 35%, 4.29 g, 88 mmol) was added dropwise to ice-cooled AcOH (5.5 g, 91.6 mmol) in water (9.75 cm³), followed by acrylonitrile (4.65 g, 87.6 mol). The mixture was stirred under reflux for 3 days, after which it was cooled with ice and aqueous TMAH (25% in water, 10.94 g, 30 mmol) was added. The mixture was kept cooled with ice for 1 hour. The crystals formed was collected by filtration and washed with water. The product was dried in high vacuum to give 3,3',3''-nitrilotripropanenitrile (2.36 g, 45.8%) as a white solid, mp 59-61° C. (lit mp 59° C.).

When NaOH was used to neutralize the reaction (literature procedure), the yield was higher, 54.4%.

K) Dicyanoethylation of cyanoacetamide

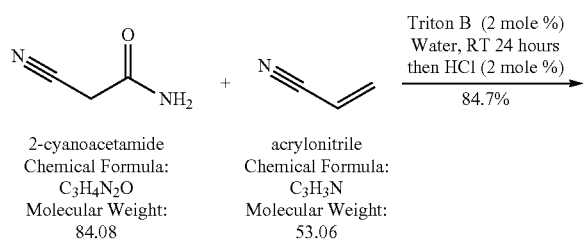

2-cyanoacetamide
Chemical Formula:
C₃H₄N₂O
Molecular Weight:
84.08 acrylonitrile
Chemical Formula:
C₃H₃N
Molecular Weight:
53.06

Triton B (2 mole %)
Water, RT 24 hours
then HCl (2 mole %)
84.7%

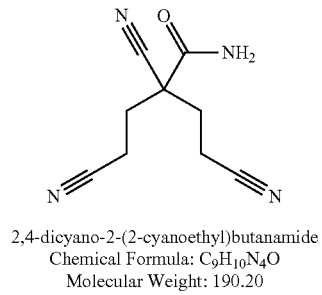

2,4-dicyano-2-(2-cyanoethyl)butanamide
Chemical Formula: C₉H₁₀N₄O
Molecular Weight: 190.20

To a stirred mixture of cyanoacetamide (2.52 g, 29.7 mmol) and Triton B (40% in MeOH, 0.3 g, 0.7 mmol) in water (5 cm³) was added acrylonitrile (3.18 g, 59.9 mmol) over 30 minutes with cooling. The mixture was then stirred at room temperature for 30 min and then allowed to stand for 1 hour. EtOH (20 g) and 1M HCl (0.7 cm³) were added and the mixture was heated until all solid had dissolved. Cooling to room temperature gave crystals that were collected by filtration and recrystallised from EtOH to give 2,4-dicyano-2-(2-cyanoethyl)butanamide (4.8 g, 84.7%) as a pale yellow solid, mp 118-120° C. (lit mp 118° C.).

L) N,N-Dicyanoethylation of anthranilonitrile

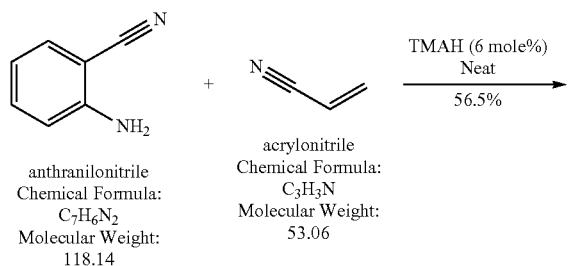

anthranilonitrile
Chemical Formula:
C₇H₆N₂
Molecular Weight:
118.14 acrylonitrile
Chemical Formula:
C₃H₃N
Molecular Weight:
53.06

TMAH (6 mole%)
Neat
56.5%

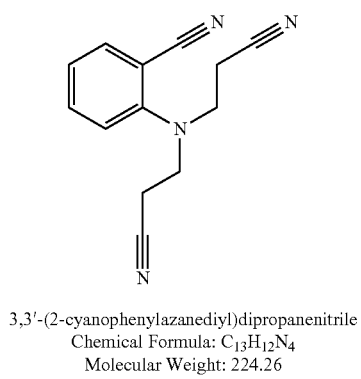

3,3'-(2-cyanophenylazanediyl)dipropanenitrile
Chemical Formula: C₁₃H₁₂N₄
Molecular Weight: 224.26

Anthranilonitrile (2 g, 16.9 mmol) was mixed with acrylonitrile (2.015 g, 38 mmol) at 0° C. and TMAH (25% in water, 0.1 cm³, 0.1 g, 2.7 mmol) was added. The mixture was then stirred overnight, allowing it to warm to room temperature slowly. The product was dissolved in CH₂Cl₂ and filtered through silica using a mixture of Et₂O and CH₂Cl₂ (1:1, 250 cm³). The filtrate was evaporated to dryness and the solid product was recrystallised from EtOH (5 cm³) to give 3,3'-(2-cyanophenylazanediyl)dipropanenitrile (2.14 g, 56.5%) as an off-white solid, mp 79-82° C.

M) Dicyanoethylation of malononitrile

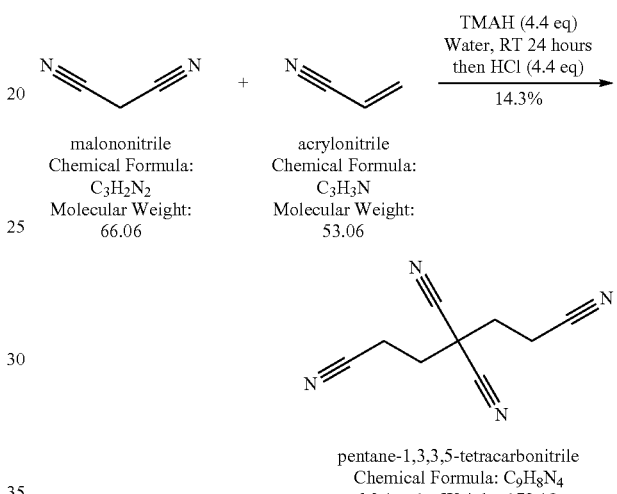

malononitrile
Chemical Formula:
C₃H₂N₂
Molecular Weight:
66.06 acrylonitrile
Chemical Formula:
C₃H₃N
Molecular Weight:
53.06

TMAH (4.4 eq)
Water, RT 24 hours
then HCl (4.4 eq)
14.3% pentane-1,3,3,5-tetracarbonitrile
Chemical Formula: C₉H₈N₄
Molecular Weight: 172.19

Malononitrile (5 g, 75.7 mmol) was dissolved in dioxane (10 cm³), followed by trimethylbenzylammonium hydroxide (Triton B, 40% in MeOH, 1.38 g, 3.3 mmol). The mixture was cooled while acrylonitrile (8.3 g, 156 mmol) was added. The mixture was stirred overnight, allowing it to warm to room temperature slowly. It was then neutralized with HCl (1 M, 3.3 cm³) and poured into ice-water. The mixture was extracted with CH₂Cl₂ (200 cm³) and the extracts were evaporated under reduced pressure. The product was purified by column chromatography (silica, 1:1 EtOAc-petroleum) followed by recrystallisation to give 1,3,3,5-tetracarbonitrile (1.86 g, 14.3%), mp 90-92° C. (lit mp 92° C.).

N) Tetracyanoethylation of pentaerythritol

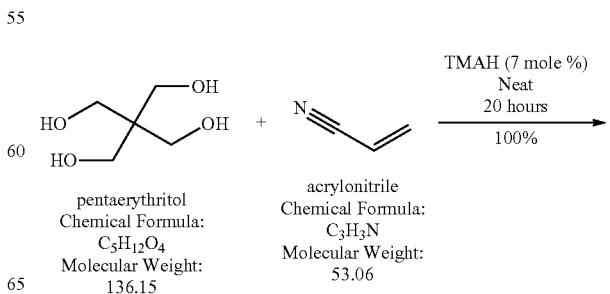

pentaerythritol
Chemical Formula:
C₅H₁₂O₄
Molecular Weight:
136.15 acrylonitrile
Chemical Formula:
C₃H₃N
Molecular Weight:
53.06

TMAH (7 mole %)
Neat
20 hours
100%

-continued

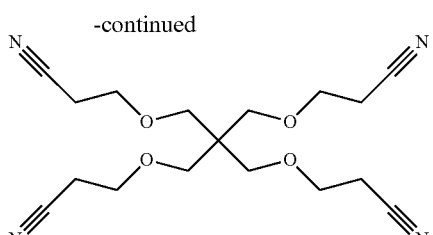

3,3'-(2,2-bis((2-cyanoethoxy)methyl)propane-
1,3-diyl)bis(oxy)dipropanenitrile
Chemical Formula: C₁₇H₂₄N₄O₄
Molecular Weight: 348.40

Pentaerythritol (2 g, 14.7 mmol) was mixed with acrylonitrile (5 cm³, 4.03 g, 76 mmol) and the mixture was cooled in an ice-bath while tetramethylammonium hydroxide (=TMAH, 25% in water, 0.25 cm³, 0.254 g, 7 mmol) was added. The mixture was then stirred at room temperature for 20 hours. After the reaction time the mixture was filtered through silica using a mixture of Et₂O and CH₂Cl₂ (1:1, 250 cm³) and the filtrated was evaporated under reduced pressure to give 3,3'-(2,2-bis((2-cyanoethoxy)methyl)propane-1,3-diyl)bis(oxy)dipropanenitrile (5.12 g, 100%) as a colourless oil.

O) Hexacyanoethylation of sorbitol

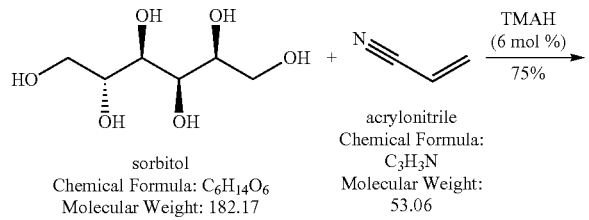

sorbitol
Chemical Formula: C₆H₁₄O₆
Molecular Weight: 182.17 acrylonitrile
Chemical Formula:
C₃H₃N
Molecular Weight:
53.06

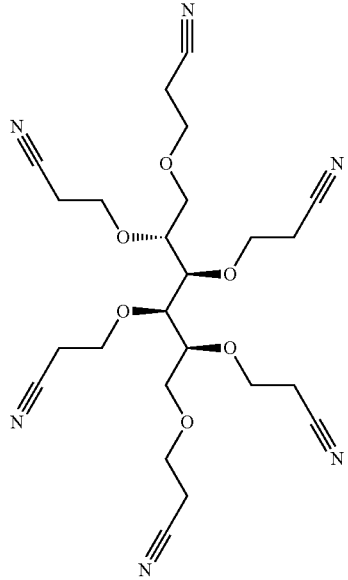

Chemical Formula: C₂₄H₃₂N₆O₆
Molecular Weight: 500.55

Sorbitol (2 g, 11 mmol) was mixed with acrylonitrile (7 cm³, 5.64 g, 106 mmol) and the mixture was cooled in an ice-bath while tetramethylammonium hydroxide (=TMAH, 25% in water, 0.25 cm³, 0.254 g, 7 mmol) was added. The mixture was then stirred at room temperature for 48 hours, adding another 0.25 cm³ of TMAH after 24 hours. After the reaction time, the mixture was filtered through silica using a mixture of Et₂O and CH₂Cl₂ (1:1, 250 cm³) and the filtrate was evaporated under reduced pressure to give a fully cyanoethylated product (4.12 g, 75%) as a colourless oil.

P) Tricyanoethylation of diethanolamine to give 3,3'-(2,2'-(2-cyanoethylazanediyl)bis(ethane-2,1-diyl)bis(oxy))dipropanenitrile

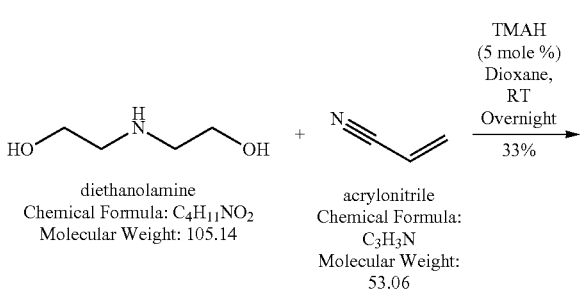

diethanolamine
Chemical Formula: C₄H₁₁NO₂
Molecular Weight: 105.14 acrylonitrile
Chemical Formula:
C₃H₃N
Molecular Weight:
53.06

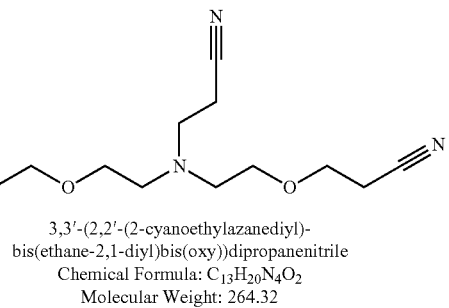

3,3'-(2,2'-(2-cyanoethylazanediyl)-
bis(ethane-2,1-diyl)bis(oxy))dipropanenitrile
Chemical Formula: C₁₃H₂₀N₄O₂
Molecular Weight: 264.32

To an ice-cooled stirred solution of diethanolamine (2 g, 19 mmol) and TMAH (25% in water, 0.34 cm³, 0.35 g, 9.5 mmol) in dioxane (5 cm³) was added acrylonitrile (3.53 g, 66.1 mmol) dropwise. The mixture was then stirred overnight, and allowed to warm to room temperature. More acrylonitrile (1.51 g, 28 mmol) and TMAH (0.25 cm³, 7 mmol) was added and stirring was continued for additional 24 h. The crude mixture was filtered through a pad of silica (Et₂O/CH₂Cl₂ as eluent) and evaporated to remove dioxane. The residue was purified by column chromatography (silica, Et₂O to remove impurities followed by EtOAc to elute product) to give 3,3'-(2,2'-(2-cyanoethylazanediyl)bis(ethane-2,1-diyl) bis(oxy))dipropanenitrile (1.67 g, 33%) as an oil.

Example 2

Reactions to Produce amidoxime Compounds
According to the Invention

The following examples are reactions that can be used to produce amidoxime compounds having multiple amidoxime functional groups according to one embodiment of the invention.

A) Reaction of adiponitrile

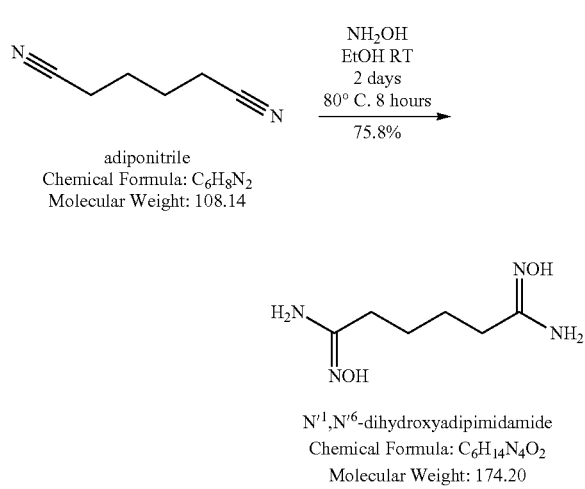

adiponitrile
Chemical Formula: $C_6H_8N_2$
Molecular Weight: 108.14

$N'^1,N'^6$-dihydroxyadipimidamide
Chemical Formula: $C_6H_{14}N_4O_2$
Molecular Weight: 174.20

Adiponitrile (1 g, 9 mmol) and hydroxylamine (50% in water, 1.24 cm3, 1.34 g, 20 mmol, 2.2 eq) in EtOH (10 cm3) were stirred at room temperature for 2 days and then at 80° C. for 8 hours. The mixture was allowed to cool and the precipitated crystals were collected by filtration and dried in high vacuum line to give the product N'1,N'6-dihydroxyadipimidamide (1.19 g, 75.8%) as a white solid, mp 160.5 (decomposed) (lit decomposed 168-170° C.

B) Reaction of sebaconitrile

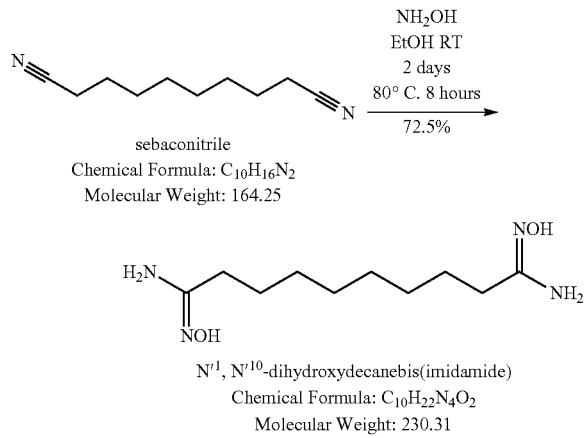

sebaconitrile
Chemical Formula: $C_{10}H_{16}N_2$
Molecular Weight: 164.25

$N'^1, N'^{10}$-dihydroxydecanebis(imidamide)
Chemical Formula: $C_{10}H_{22}N_4O_2$
Molecular Weight: 230.31

Sebaconitrile (1 g, 6 mmol) and hydroxylamine (50% in water, 0.85 cm3, 0.88 g, 13.4 mmol, 2.2 eq) in EtOH (12 cm$^3$) were stirred at room temperature for 2 days and then at 80° C. for 8 hours. The mixture was allowed to cool and the precipitated crystals were collected by filtration and dried in high vacuum line to give the product N'1,N'10-dihydroxydecanebis(imidamide) (1 g, 72.5%); mp 182° C.

C) Reaction of iminodiacetonitrile

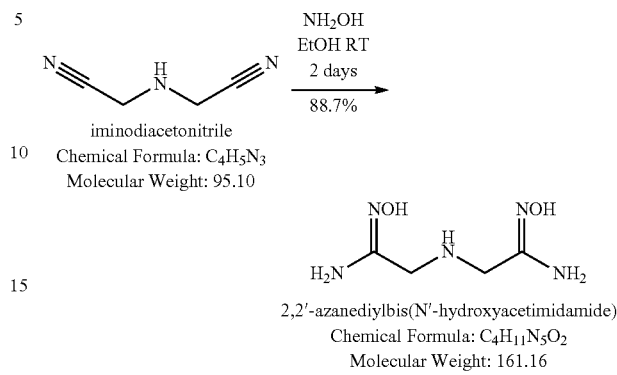

iminodiacetonitrile
Chemical Formula: $C_4H_5N_3$
Molecular Weight: 95.10

2,2'-azanediylbis(N'-hydroxyacetimidamide)
Chemical Formula: $C_4H_{11}N_5O_2$
Molecular Weight: 161.16

Commercial iminodiacetonitrile (Alfa-Aesar) was purified by dispersing the compound in water and extracting with dichloromethane, then evaporating the organic solvent from the extracts to give a white solid. Purified iminodiacetonitrile (0.82 g) and hydroxylamine (50% in water, 2.12 ml, 2.28 g, 34.5 mmol, 4 eq) in MeOH (6.9 ml) and water (6.8 ml) were stirred at room temperature for 48 hours. Evaporation of volatiles under reduced pressure gave a colorless liquid which was triturated with EtOH (40° C.) to give 2,2'-azanediylbis (N'-hydroxyacetimidamide) (1.23 g, 88.7%) as a white solid, mp 135-136° C., (lit mp 138° C.).

D) Reaction of 3,3',3"-nitrilotripropanenitrile with hydroxylamine to give 3,3',3"-nitrilotris(N'-hydroxypropanimidamide)

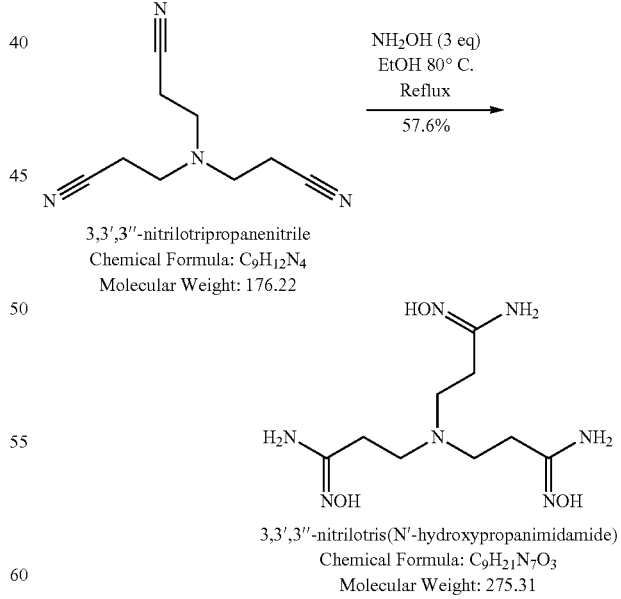

3,3',3"-nitrilotripropanenitrile
Chemical Formula: $C_9H_{12}N_4$
Molecular Weight: 176.22

3,3',3"-nitrilotris(N'-hydroxypropanimidamide)
Chemical Formula: $C_9H_{21}N_7O_3$
Molecular Weight: 275.31

A solution of 3,3',3"-nitrilotripropanenitrile (2 g, 11.35 mmol) and hydroxylamine (50% in water, 2.25 g, 34 mmol) in EtOH (25 cm$^3$) was stirred at 80° C. overnight, then at room temperature for 24 hours. The white precipitate was collected by filtration and dried in high vacuum to give 3,3',3"-nitrilotris(N'-hydroxypropanimidamide) (1.80 g, 57.6%) as a white crystalline solid, mp 195-197° C. (decomposed)

E) Reaction of 3,3'-(2,2'-(2-cyanoethylazanediyl)bis(ethane-2,1-diyl)bis(oxy))dipropanenitrile with hydroxylamine to give 3,3'-(2,2'-(3-amino-3-(hydroxyimino)propylazanediyl(bis(ethane-2,1-diyl))bis(oxy)bis(N'-hydroxypropanimidamide)

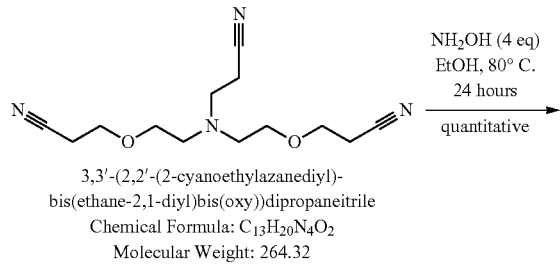

3,3'-(2,2'-(2-cyanoethylazanediyl)-bis(ethane-2,1-diyl)bis(oxy))dipropaneitrile
Chemical Formula: $C_{13}H_{20}N_4O_2$
Molecular Weight: 264.32

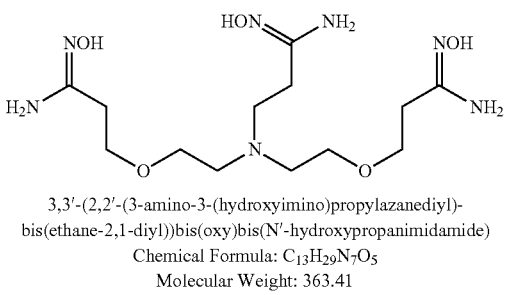

3,3'-(2,2'-(3-amino-3-(hydroxyimino)propylazanediyl)-bis(ethane-2,1-diyl))bis(oxy)bis(N'-hydroxypropanimidamide)
Chemical Formula: $C_{13}H_{29}N_7O_5$
Molecular Weight: 363.41

Treatment of 3,3'-(2,2'-(2-cyanoethylazanediyl)bis(ethane-2,1-diyl)bis(oxy))dipropanenitrile (0.8 g, 3 mmol) with $NH_2OH$ (0.74 cm$^3$, 12.1 mmol) in EtOH (8 cm$^3$) gave 3,3'-(2,2'-(3-amino-3-(hydroxyimino)propylazanediyl)bis(ethane-2,1-diyl))bis(oxy)bis(N'-hydroxypropanimidamide) (1.09 g, 100%) as an oil.

F) Reaction of iminodipropionitrile

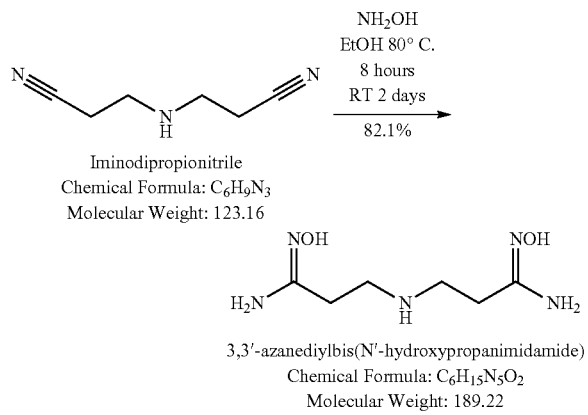

Iminodipropionitrile
Chemical Formula: $C_6H_9N_3$
Molecular Weight: 123.16

3,3'-azanediylbis(N'-hydroxypropanimidamide)
Chemical Formula: $C_6H_{15}N_5O_2$
Molecular Weight: 189.22

Iminodipropionitrile (1 g, 8 mmol) and hydroxylamine (50% in water, 1 cm$^3$, 1.07 g, 16 mmol, 2 eq) in EtOH (8 cm$^3$) were stirred at room temperature for 2 days and then at 80° C. for 8 hours. The mixture was allowed to cool and the precipitated crystals were collected by filtration and dried in high vacuum line to give the product 3,3'-azanediylbis(N'-hydroxypropanimidamide) (1.24 g, 82.1%) as a white solid, mp 180° C. (lit 160° C.).

G) Reaction of 3,3',3'',3'''-(ethane-1,2-diylbis(azanetriyl))tetrapropanenitrile to give 3,3',3'',3'''-(ethane-1,2-diylbis(azanetriyl))tetrakis(N'-hydroxypropanimidamide) to produce EDTA analogue

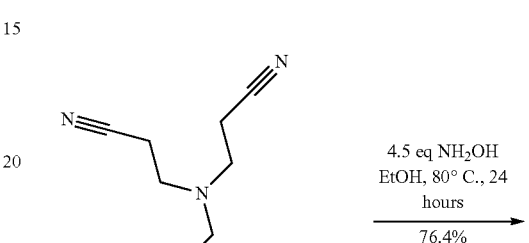

3,3',3'',3'''-(ethane-1,2-diylbis(azanetriyl))-tetrapropanenitrile
Chemical Formula: $C_{14}H_{20}N_6$
Molecular Weight: 272.35

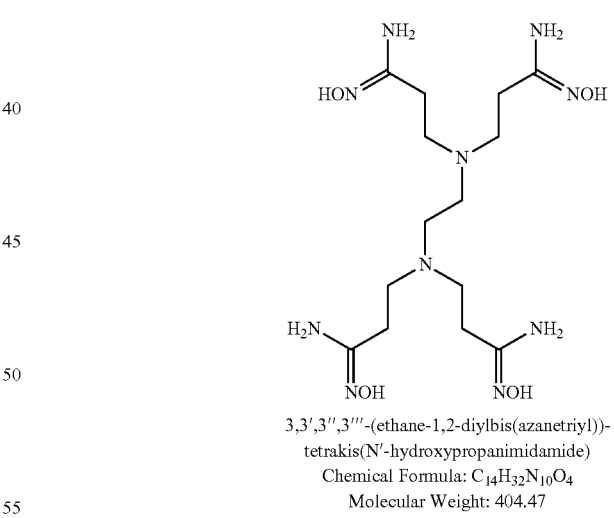

3,3',3'',3'''-(ethane-1,2-diylbis(azanetriyl))-tetrakis(N'-hydroxypropanimidamide)
Chemical Formula: $C_{14}H_{32}N_{10}O_4$
Molecular Weight: 404.47

A solution of 3,3',3'',3'''-(ethane-1,2-diylbis(azanetriyl))tetrapropanenitrile (1 g, 4 mmol) and $NH_2OH$ (50% in water, 1.1 cm$^3$, 18.1 mmol) in EtOH (10 cm$^3$) was stirred at 80° C. for 24 hours and was then allowed to cool to room temperature. The solid formed was collected by filtration and dried under vacuum to give 3,3',3'',3'''-(ethane-1,2-diylbis(azanetriyl))tetrakis(N'-hydroxypropanimidamide) (1.17 g, 76.4%) as a white solid, mp 191-192° C.

H) Reaction of 3,3'-(2,2-bis((2-cyanoethoxy)methyl)propane-1,3-diyl)bis(oxy)dipropanenitrile with hydroxylamine to give 3,3'-(2,2-bis((3-(hydroxyamino)-3-iminopropoxy)methyl)propane-1,3-diyl)bis(oxy)bis(N-hydroxypropanimidamide)

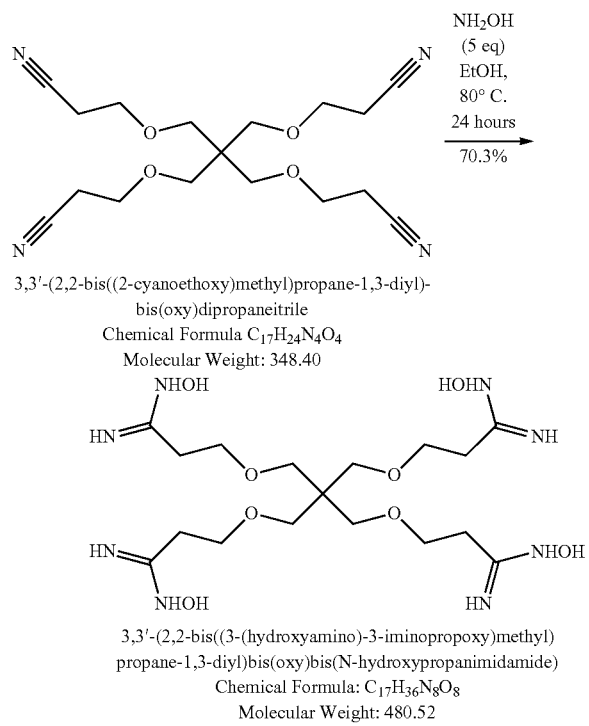

3,3'-(2,2-bis((2-cyanoethoxy)methyl)propane-1,3-diyl)-bis(oxy)dipropaneitrile
Chemical Formula $C_{17}H_{24}N_4O_4$
Molecular Weight: 348.40

3,3'-(2,2-bis((3-(hydroxyamino)-3-iminopropoxy)methyl)propane-1,3-diyl)bis(oxy)bis(N-hydroxypropanimidamide)
Chemical Formula: $C_{17}H_{36}N_8O_8$
Molecular Weight: 480.52

To a solution of 3,3'-(2,2-bis((2-cyanoethoxy)methyl)propane-1,3-diyl)bis(oxy)dipropanenitrile (1 g, 2.9 mmol) in EtOH (10 ml) was added NH2OH (50% in water, 0.88 ml, 0.948 g, 14.4 mmol), the mixture was stirred at 80° C. for 24 hours and was then cooled to room temperature. Evaporation of the solvent and excess NH2OH in the rotary evaporator followed by high vacuum for 12 hours gave 3,3'-(2,2-bis((3-(hydroxyamino)-3-iminopropoxy)methyl)propane-1,3-diyl)bis(oxy)bis(N-hydroxypropanimidamide) (0.98 g, 70.3%) as a white solid, mp 60° C.

I) Reaction of 3,3'-(2-cyanophenylazanediyl)dipropanenitrile with hydroxylamine to give 3,3'42-(N'-hydroxycarbamimidoyl)phenylazanediyl)bis(N'-hydroxypropanimidamide)

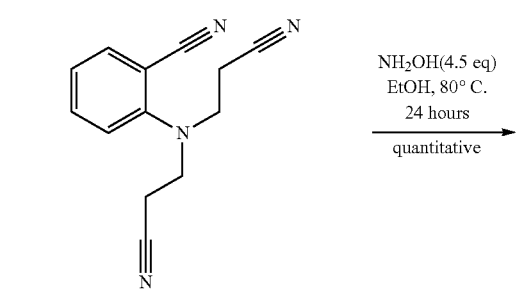

3,3'-(2-cyanophenylazanediyl)dipropanenitrile
Chemical Formula: $C_{13}H_{12}N_4$
Molecular Weight: 224.26

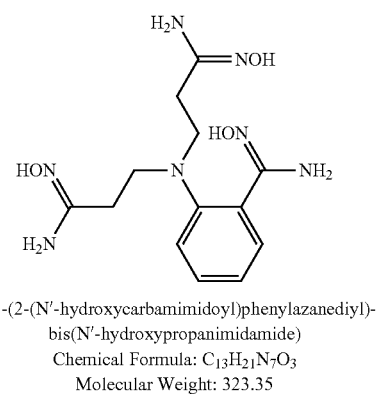

3,3'-(2-(N'-hydroxycarbamimidoyl)phenylazanediyl)-bis(N'-hydroxypropanimidamide)
Chemical Formula: $C_{13}H_{21}N_7O_3$
Molecular Weight: 323.35

Treatment of 3,3'(2-cyanophenylazanediyl)dipropanenitrile (1 g, 4.46 mmol) with NH2OH (1.23 ml, 20 mmol) in EtOH (10 ml) gave a crude product that was triturated with $CH_2Cl_2$ to give 3,3'-(2-(N'-hydroxycarbamimidoyl)phenylazanediyl)bis(N'-hydroxypropanimidamide) (1.44 g, 100%) as a solid, decomposed 81° C.

J) Reaction of N,N-bis(2-cyanoethyl)acetamide with hydroxylamine to give N,N-bis(3-amino-3-(hydroxyimino)propyl)acetamide

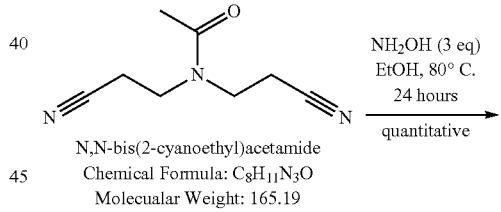

N,N-bis(2-cyanoethyl)acetamide
Chemical Formula: $C_8H_{11}N_3O$
Molecualar Weight: 165.19

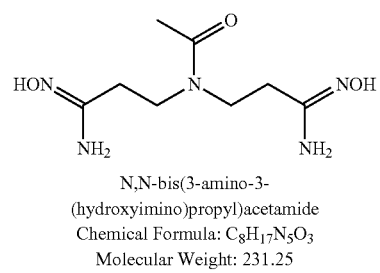

N,N-bis(3-amino-3-(hydroxyimino)propyl)acetamide
Chemical Formula: $C_8H_{17}N_5O_3$
Molecular Weight: 231.25

Treatment of N,N-bis(2-cyanoethyl)acetamide (0.5 g, 3.03 mmol) with $NH_2OH$ (0.56 ml, 9.1 mmol) in EtOH (5 ml) gave N,N-bis(3-amino-3-(hydroxyimino)propyl)acetamide (0.564 g, 100%) as a white solid, mp 56.4-58° C.

K) Reaction of 3,3'-(2,2'-(methylazanediyl)bis(ethane-2,1-diyl)bis(oxy))dipropanenitrile with hydroxylamine to give 3,3'-(2,2'-(methylazanediyl)bis(ethane-2,1-diyl)bis(oxy))bis(W-hydroxypropanimidamide)

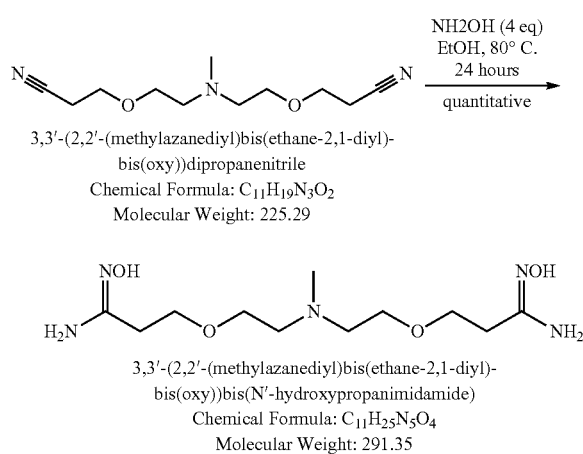

Treatment of 3,3'-(2,2'-(methylazanediyl)bis(ethane-2,1-diyl)bis(oxy)) dipropanenitrile (1 g, 4.4 mmol) with NH$_2$OH (0.82 ml, 13.3 mmol) in EtOH (10 ml) gave 3,3'-(2,2'-(methylazanediyl)bis(ethane-2,1-diyl)bis(oxy))bis(N'-hydroxypropanimidamide) (1.28 g, 100%) as an oil.

L) Reaction of glycol derivative 3,3'-(ethane-1,2-diylbis(oxy))dipropanenitrile

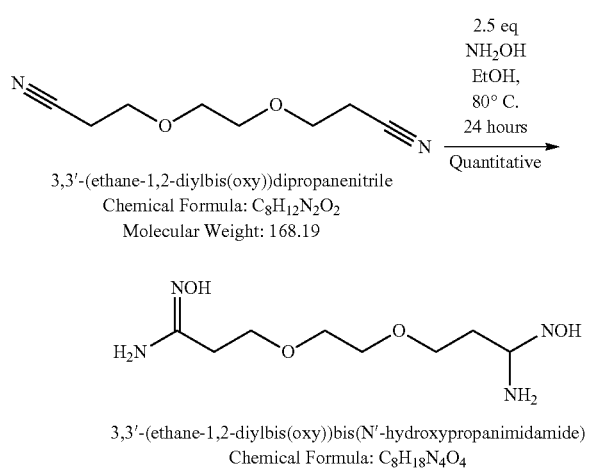

A solution of 3,3'-(ethane-1,2-diylbis(oxy))dipropanenitrile (1 g, 5 mmol) and NH$_2$OH (50% in water, 0.77 cm$^3$, 12.5 mmol) in EtOH (10 cm$^3$) was stirred at 80° C. for 24 hours and then at room temperature for 24 hours. The solvent and excess NH$_2$OH were evaporated off and the residue was freeze-dried to give 3,3'-(ethane-1,2-diylbis(oxy))bis(N'-hydroxypropanimidamide) (1.33 g, 100%) as a viscous oil.

M) Reaction of 3,3'-(piperazine-1,4-diyl)dipropanenitrile

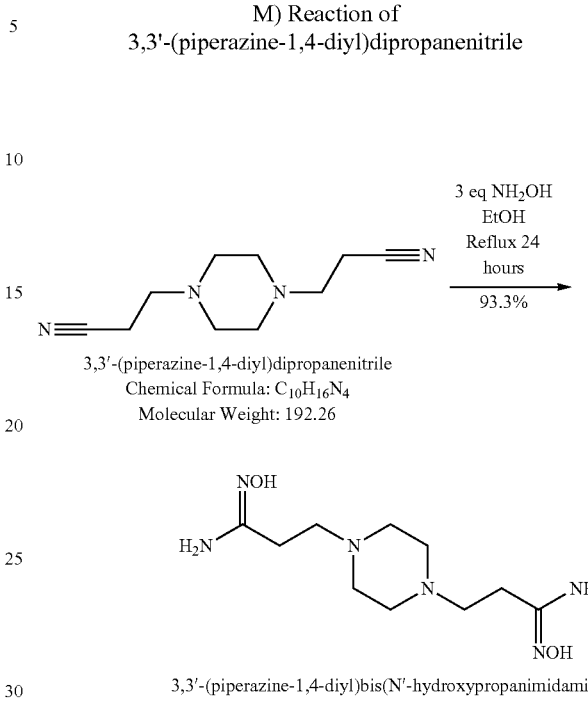

A solution of 3,3'-(piperazine-1,4-diyl)dipropanenitrile (1 g, 5.2 mmol) and NH$_2$OH (50% in water, 0.96 cm$^3$, 15.6 mmol) in EtOH (10 cm$^3$) were heated to reflux for 24 hours, after which the mixture was allowed to cool to room temperature. The solid formed was collected by filtration and dried in high vacuum line to give 3,3'-(piperazine-1,4-diyl)bis(N'-hydroxypropanimidamide) (1.25 g, 93.3%) as a white solid, decp 238° C. (brown coloration at >220° C.).

N) Reaction of cyanoethylated sorbitol compound with hydroxylamine to give 1,2,3,4,5,6-hexakis-O-[3-(hydroxyamino)-3-iminopropyl Hexitol

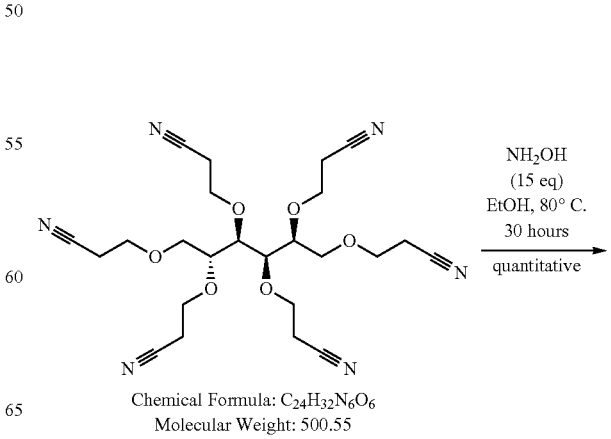

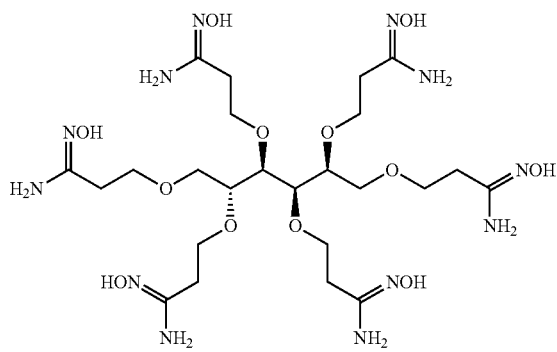

Hexitol, 1,2,3,4,5,6-hexakis-O-[3-(hydroxyamino)-
3-iminopropyl
Chemical Formula: $C_{24}H_{50}N_{12}O_{12}$
Molecular Weight: 698.73

A solution of cyanoethylated product of sorbitol (0.48 g, 0.96 mmol) and $NH_2OH$ (50% in water, 0.41 ml, 0.44 g, 6.71 mmol) in EtOH (5 ml) was stirred at 80° C. for 24 hours. Evaporation of solvent and NMR analysis of the residue showed incomplete conversion. The product was dissolved in water (10 ml) and EtOH (100 ml) and $NH_2OH$ (0.5 g, 7.6 mmol) was added. The mixture was stirred at 80° C. for a further 7 hours. Removal of all volatiles after the reaction gave 1,2,3,4,5,6-hexakis-O-[3-(hydroxyamino)-3-iminopropyl Hexitol, (0.67 g, 100%) as a white solid, mp 92-94° C. (decomposed).

O) Reaction of phthalonitrile

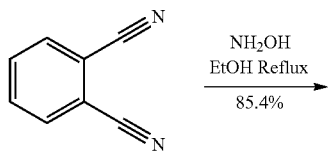

phthalonitrile
Chemical Formula: $C_8H_4N_2$
Molecular Weight: 128.13

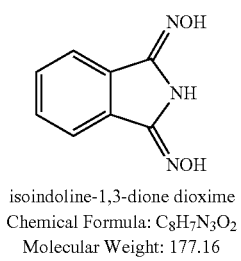

isoindoline-1,3-dione dioxime
Chemical Formula: $C_8H_7N_3O_2$
Molecular Weight: 177.16

Phthalonitrile (1 g, 7.8 mmol) and hydroxylamine (1.9 cm³, 31.2 mmol, 4 eq) in EtOH (25 cm³) were stirred under reflux for 60 hours, after which the volatiles were removed under reduced pressure and the residue was washed with EtOH (2 cm³) and $CH_2Cl_2$ (2 cm³) to give the cyclised product isoindoline-1,3-dione dioxime (1.18 g, 85.4%) as a pale yellow solid, mp 272-275° C. (decomposed) (lit 271° C.).

P) Reaction of 2-cyanophenylacetonitrile

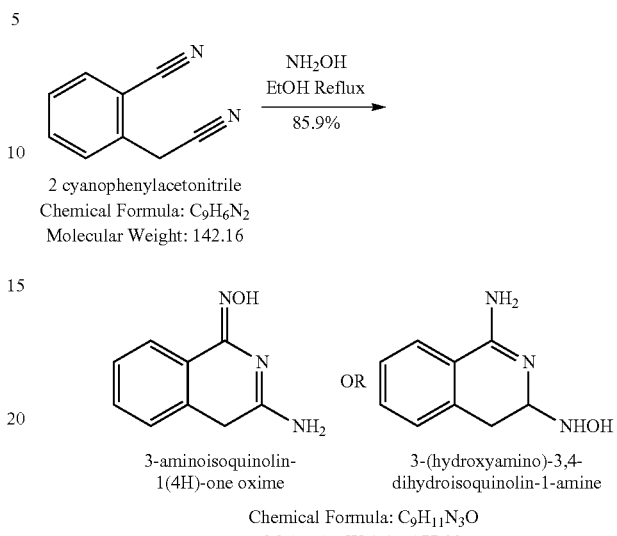

2 cyanophenylacetonitrile
Chemical Formula: $C_9H_6N_2$
Molecular Weight: 142.16

3-aminoisoquinolin-1(4H)-one oxime 3-(hydroxyamino)-3,4-dihydroisoquinolin-1-amine Chemical Formula: $C_9H_{11}N_3O$
Molecular Weight: 177.20

A solution of 2-cyanophenylacetonitrile (1 g, 7 mmol) and hydroxylamine (1.7 cm³, 28.1 mmol, 4 eq) in EtOH (25 cm³) were stirred under reflux for 60 hours, after which the volatiles were removed under reduced pressure. The residue was recrystallised from EtOH-water (1:4, 15 cm³) to give the cyclised product 3-aminoisoquinolin-1(4H)-one oxime or 3-(hydroxyamino)-3,4-dihydroisoquinolin-1-amine (1.15 g, 85.9%) as a solid, mp 92.5-94.5° C.

It is also noted that amidoximes can react with each other to form imidoximes and can react with water to form hydroxamic acids. Thus, compounds having more that one amidoxime functional group may exist as the degradation products and still be efficacious as semi-conductor processing fluids within the scope of the features of the invention because they are still potent metal chelators.

Experimental Results

As noted above, semiconductor processing compositions which contain an amidoxime molecule having two or more amidoxime functional groups according to the present invention are particularly useful in treating/processing semiconductor wafers and other micro-electronic device surfaces. The compositions have a role in residue removal, resist stripping, post-CMP cleaning, and the compositions can be used as an additive for CMP slurries. The examples which follow are directed at semiconductor wafer processing applications which compare performance of amidoxime molecules having one amidoxime functional group with amidoxime molecules having two or more amidoxime functional groups.

Materials

All chemicals used in the following experiments were purchased from Wako Pure Chemical, Ltd. unless otherwise indicated. 50% ATMP (50% aqueous solution of aminotrimethylene phosphonic acid) and 60% HEDP (60% aqueous solution of hydroxyethylidene-1,1-diphosphonic acid) were purchased from Thermphos Japan. Amidoxime compounds designated herein below as "AO1", "AO3" and "AO7" were prepared as described hereinabove.

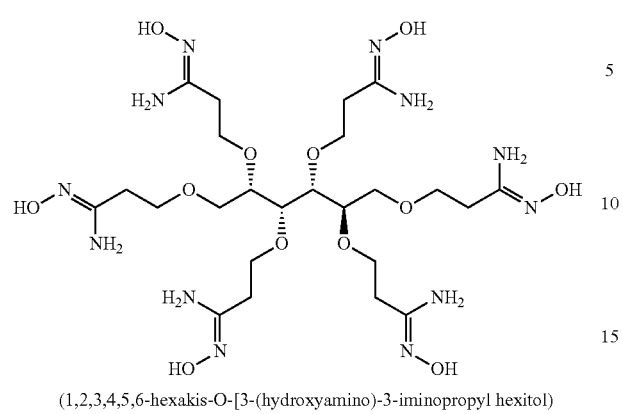

(1,2,3,4,5,6-hexakis-O-[3-(hydroxyamino)-3-iminopropyl hexitol)

AO1

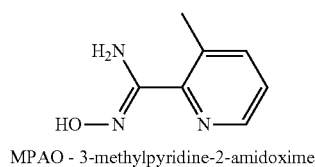

MPAO - 3-methylpyridine-2-amidoxime

AO3

(N',3-dihydroxypropanimidamimde)

AO7

(3,3',3'',3'''-(ethane-1,2-diylbis(azanetriyl))tetrakis(N'-hydroxypropanimidamide)

Compositions

Tables 1 to 5 list the components of semiconductor processing compositions that were prepared for performance testing. All compositions were prepared in quantities of 100.0 g in a 100 ml polypropylene bottle. MPAO is 3-methylpyridine-2-amidoxime which has the following chemical structure.

TABLE 1

|  | A wt % | B wt % |
|---|---|---|
| 50% THEMAH | 24.0 | 24.0 |
| 50% ATMP | 14.0 | 14.0 |
| 10% AO1 | 1.0 |  |
| MPAO |  | 1.0 |
| Deionized water | 61.0 | 61.0 |

TABLE 2

|  | C wt % | D wt % | E wt % |
|---|---|---|---|
| 50% Hydroxylamine | 2.0 | 1.0 |  |
| 70% Glycolic acid | 0.029 | 0.260 |  |
| 10% AO1 |  | 0.835 |  |
| MPAO |  |  | 1.0 |
| Deionized water | 98.0 | 97.9 | 99.0 |

TABLE 3

|  | F wt % | G wt % | H wt % | I wt % | J wt % |
|---|---|---|---|---|---|
| 6.5 wt % HEDP | 10.0 | 10.0 | 10.0 | 10.0 | 10.0 |
| 10% AO1 |  | 0.1 | 10.0 |  |  |
| AO7 |  |  |  | 0.5 |  |
| AO3 |  |  |  |  | 0.5 |
| Deionized water | 90.0 | 89.9 | 80.0 | 89.5 | 89.5 |

TABLE 4

|  | K wt % | L wt % | M wt % | N wt % | O wt % | P wt % |
|---|---|---|---|---|---|---|
| HF | 0.05 | 0.05 | 0.05 | 0.05 | 0.05 | 0.05 |
| H2O2 | 6.0 | 6.0 | 6.0 | 6.0 | 6.0 | 6.0 |
| AO1 | 0.0 | 0.1 | 0.5 | 1.0 | 1.0 | 1.0 |
| DGA |  |  |  |  | 0.5 | 1.0 |
| Deionized water | 93.95 | 93.85 | 93.45 | 92.95 | 92.45 | 91.95 |

TABLE 5

|  | Q wt % | R wt % | S wt % | T wt % | U wt % | V wt % | W wt % | X wt % | Y wt % |
|---|---|---|---|---|---|---|---|---|---|
| HF | 0.02 | 0.02 | 0.02 | 0.02 | 0.04 | 0.02 | 0.02 | 0.02 | 0.02 |
| H2O2 | 6.0 | 6.0 | 6.0 | 6.0 | 6.0 | 6.0 | 6.0 | 6.0 | 6.0 |
| AO1 | 1.0 | 1.0 | 1.0 | 1.0 | 1.0 | 1.0 | 1.0 | 1.0 | 1.0 |
| DGA | 0.5 | 0.4 |  |  |  |  |  |  |  |
| HEDP |  |  | 0.10 |  |  | 0.10 | 0.05 | 0.10 | 0.10 |
| THEMAH |  |  |  |  |  | 0.667 | 0.667 | 0.667 | 0.667 |
| Deionized water | 92.5 | 92.6 | 92.9 | 93.0 | 93.0 | 92.2 | 92.3 | 92.2 | 92.2 |

Copper Oxidation Barrier (COB) Efficiency

Figure 1B:
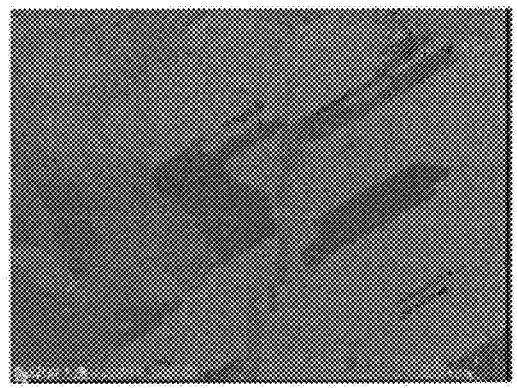
FIG. 1b is an SEM image of a copper surface where oxidation has been prevented by Copper Oxide Barrier performance of an amidoxime molecule.

CMP polished copper wafers were used in this test. Wafer coupons were immersed in de-ionized water and in test Compositions A and B, then immersed again in de-ionized water, respectively. After drying by nitrogen flow, the copper surface was observed by scanning electron microscope (SEM) (Hitachi S-5200). Typical images after the COB efficiency test are shown in FIGS. 1a and 1b. The "clean" image observed in FIG. 1b corresponds to the wafer that was cleaned with Composition A which contained compound AO1, whereas the white particles shown in the image in FIG. 1a indicate copper oxide growth on the surface of the wafer after being cleaned with Composition B which contained MPAO.

Figure 2:
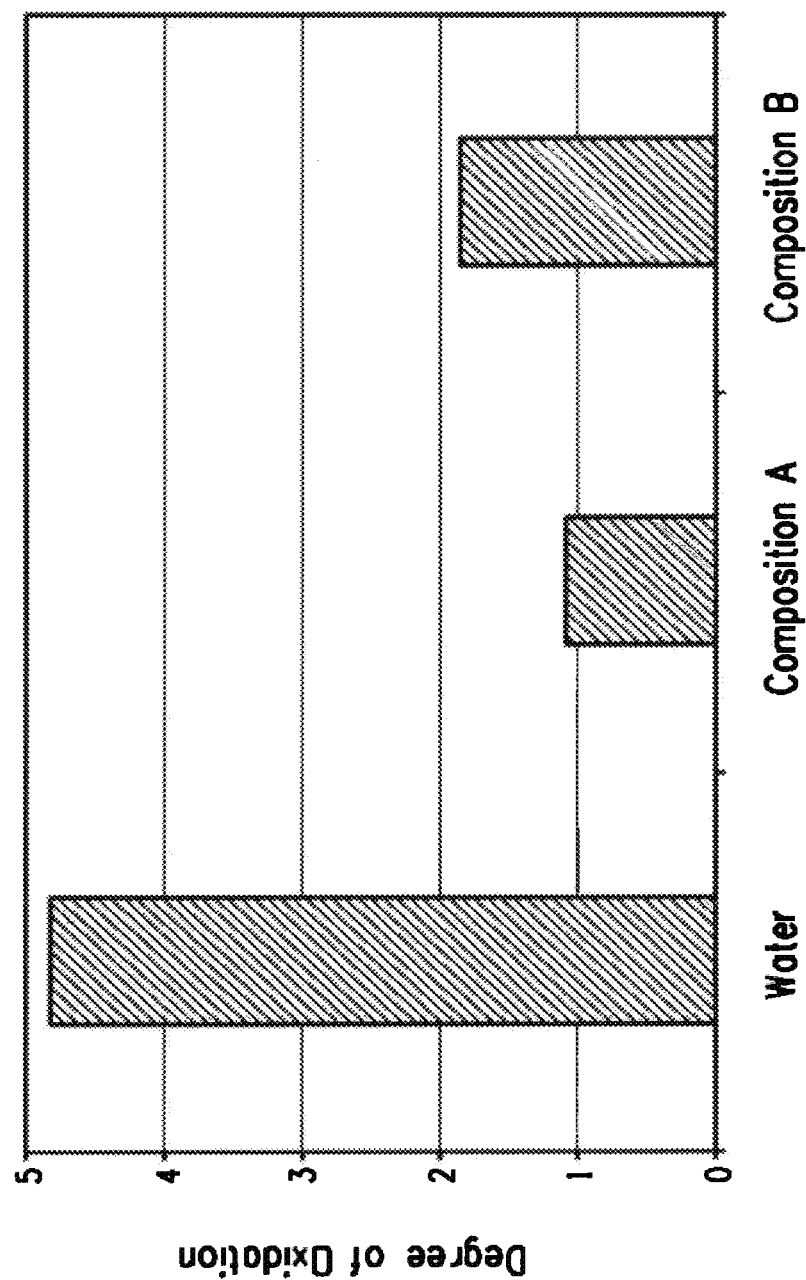
FIG. 2 is a bar graph which compares area % of particles after immersion in water, immersion in composition A and immersion in Composition B of the Examples, which suggests degrees of surface oxidation.

Area % of particles in the SEM images was then calculated by a standard imaging software for each of the test wafers. FIG. 2 is a graph which shows a comparison of area % of particles after immersion in each of water, Composition A and Composition B. The vertical bars indicate degrees of surface oxidation. Both compositions containing amidoxime compounds showed suppression of oxidation vs. water. However, Composition A, comprising compound AO1 having six amidoxime functional groups, performed better than Composition B comprising a compound having only one amidoxime functional group (MPAO).

Cu Via Bottom Per Removal for Cu/Low-k MHM Cleaning

On copper interconnects, etching stopper layer, low-k dielectric layer, capping dielectric layer and titanium nitride hard mask layer were formed by the conventional CVD process. Then, photoresist was coated on the titanium nitride hard mask layer and a designed mask pattern was formed by photolithography. The mask pattern was transferred onto the titanium nitride hard mask layer by reactive ion etching and plasma ashing. A second photoresist with via hole patterns was formed on the titanium nitride hard mask, then the resist pattern was transferred onto a capping dielectric layer. Then, the capping layer was etched to form via holes onto copper interconnects. Post etching residues (PER) were observed on via bottom and sidewalls by SEM observation.

The wafer coupons prepared as described above were cleaned with compositions C, D and E. Wafer cleanliness was then evaluated by SEM observation, and the results are recorded in Table 6, below. After cleaning with Composition C, it was observed via SEM imaging that side-wall residues were removed, whereas via-bottom residues remained. After cleaning with Composition D, it was observed via SEM imaging that sidewall residues and via-bottom residues were removed. Thus, the presence of compound AO1 in the composition was observed to assist in removing both side-wall residues and via-bottom residues. On the other hand, the SEM images indicated that the aqueous solution which contained MPAO was not effective to remove either side-wall residue or via-bottom residue.

TABLE 6

| Composition | C | D | E |
|---|---|---|---|
| Sidewall | clean | clean | residue remained |
| Via bottom | residue remained | clean | residue remained |

Particle Removal Efficiency

Commercially available Cu/Low-k patterned wafers purchased from SVTC Technologies L.L.C. were used in this test. The wafers were polished by using an Applied Mirra 200 mm CMP tool with a standard polishing recipe. After polishing, the wafers were cleaned with deionized water by using a Lam Ontrak cleaning tool with a standard cleaning recipe. The polished wafers were cleaved into some coupons for a particle removal efficiency test.

A first wafer coupon (FIG. 3a) was immersed in Composition F (0.65 wt % HEDP) shown above in Table 3, respectively for 60 seconds. The coupon was rinsed with de-ionized water and dried by nitrogen flow, and then it was immersed again in deionized water for 5 minutes, rinsed and dried by nitrogen flow. The remaining wafer coupons were dipped first in a 0.65 wt % HEDP solution to remove copper oxide, and then each was dipped in one of Composition G (FIG. 3b), H (FIG. 3c), I (FIG. 3d) or J (FIG. 3e) for 1 minute, rinsed with deionized water and then dried by nitrogen flow. Each was then immersed again in deionized water for 5 minutes, rinsed and dried by nitrogen flow. The surfaces of the treated wafer coupons were observed by scanning electron microscope (SEM) (Hitachi S-5500) to determine the presence of undesirable particulate matter. The experiment was designed to evaluate removal efficiency of particulate matter which appears as white particles on the SEM images. Dark specks which can also be observed in the SEM images are the result of pitting, and were not considered when evaluating the particle removal results of the experiments. FIGS. 3a through 3e show the images of the coupons treated with Compositions F through J listed in Table 3.

Figure 3A:
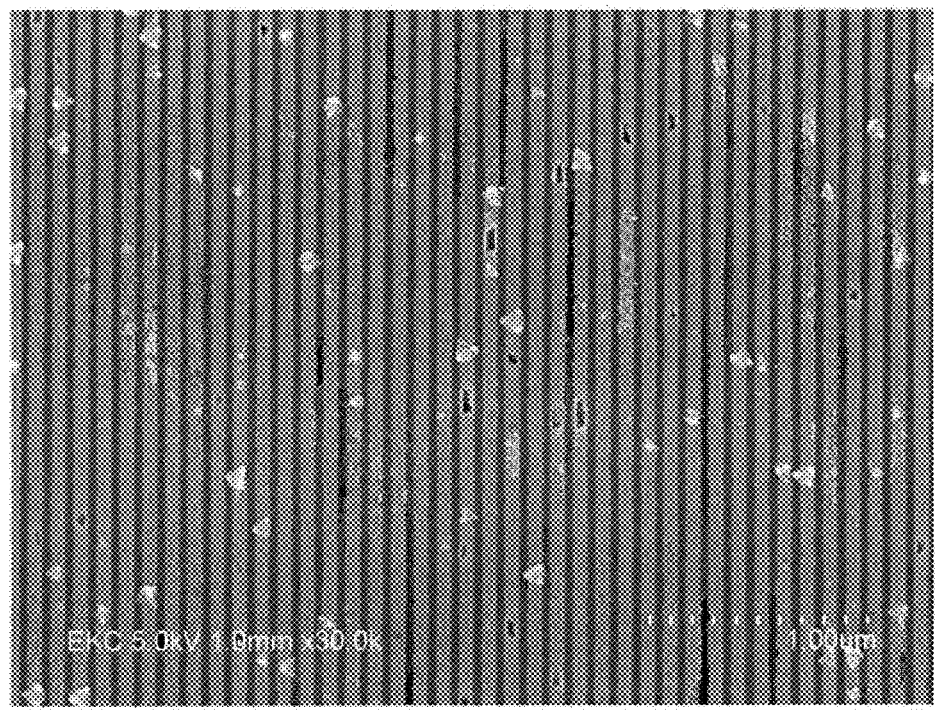
FIGS. 3a-3e are images which compare particle removal efficiency of wafer coupon surfaces after immersion in Compositions F through J of the Examples.
Figure 3B:
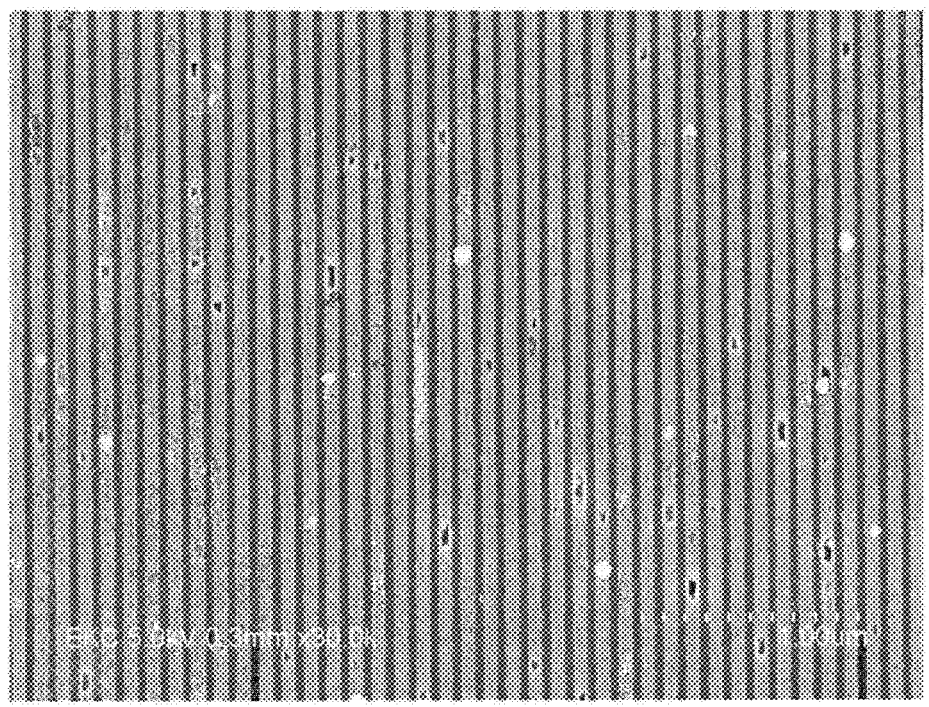
Figure 3C:
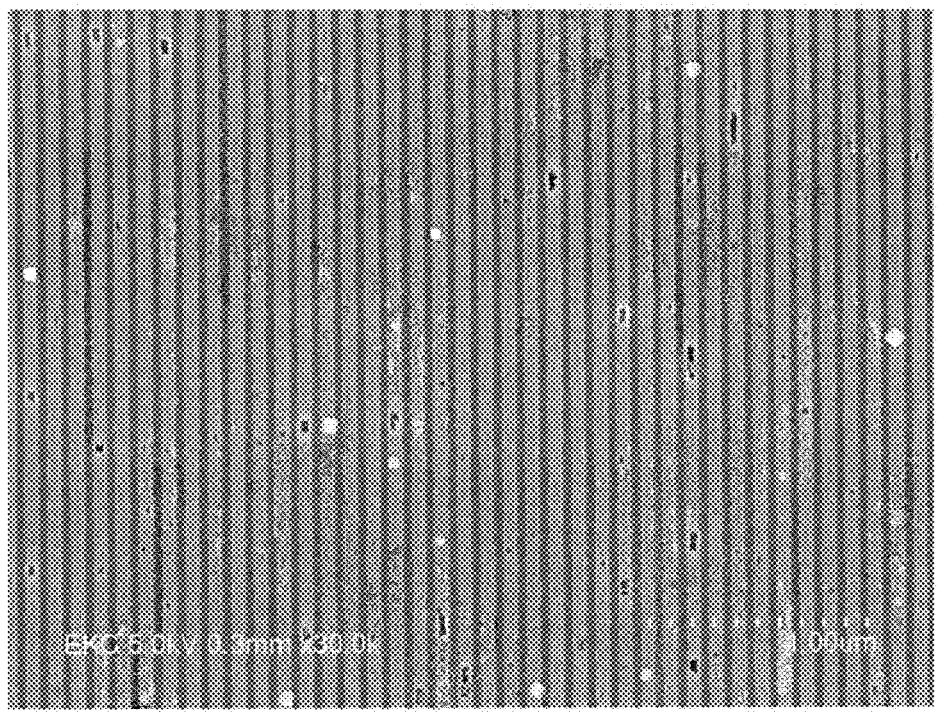
Figure 3D:
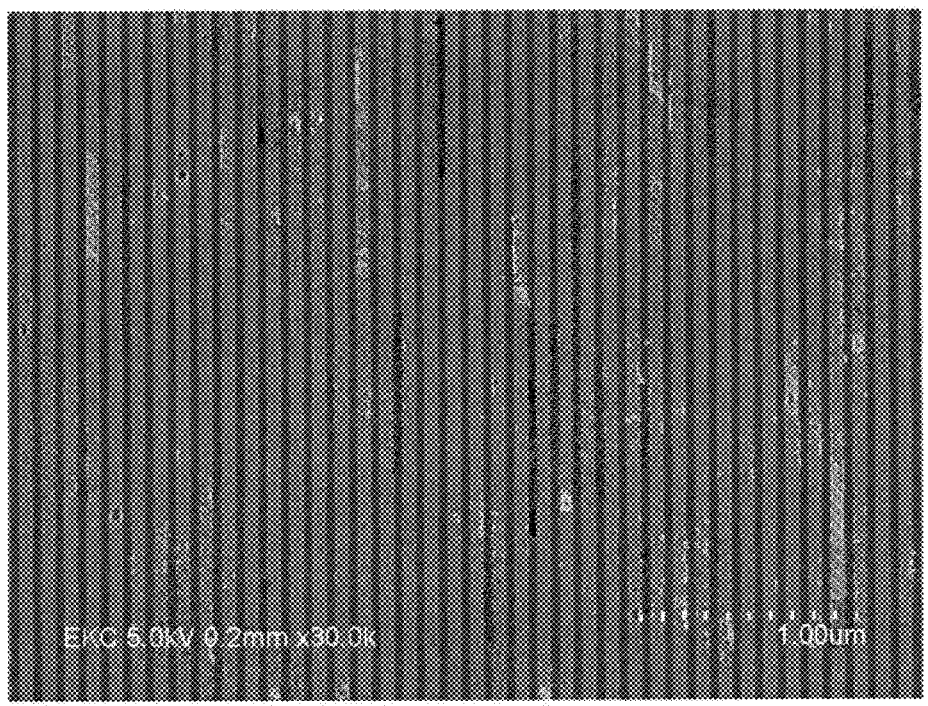
Figure 3E:
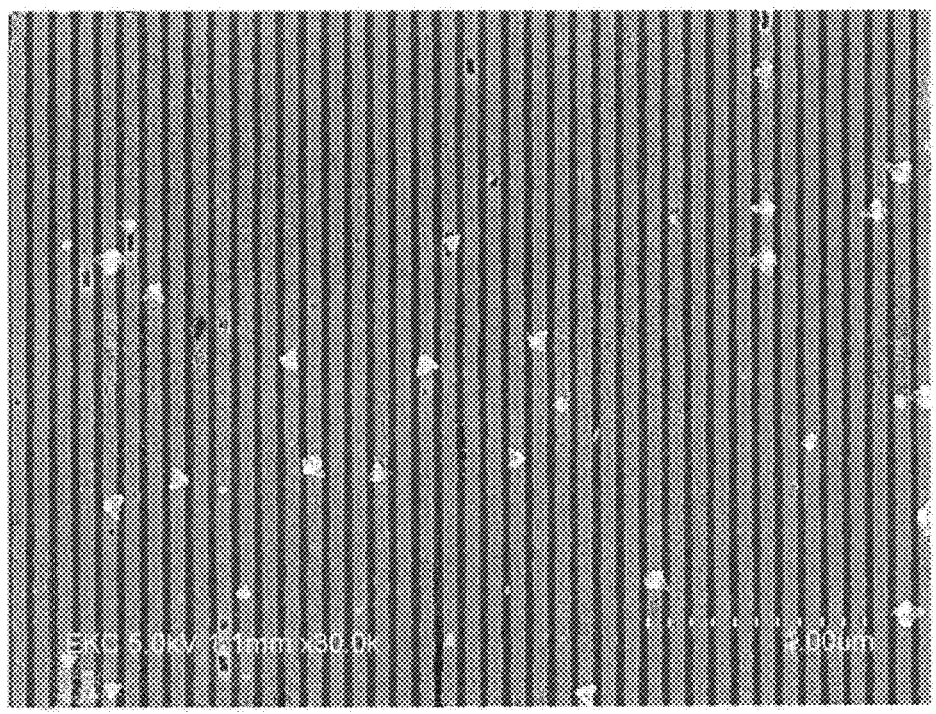

The SEM images shown in FIGS. 3a through 3e indicate particle removal efficiency of HEDP aqueous solutions with and without amidoxime compounds. FIGS. 3b, 3c and 3d show fewer particles on the wafer surface, i.e., fewer white particles, compared with FIG. 3a, which suggests that the presence of amidoxime compounds AO1 or AO7 in the cleaning compositions improves particle removal efficiency. The level of undesirable particulate matter for the wafer surfaces treated with Composition F and Composition J are almost the same, and relatively high, as seen in FIGS. 3a and 3e, respectively.

Etch Rate of Various Metal Films

Figure 4A:
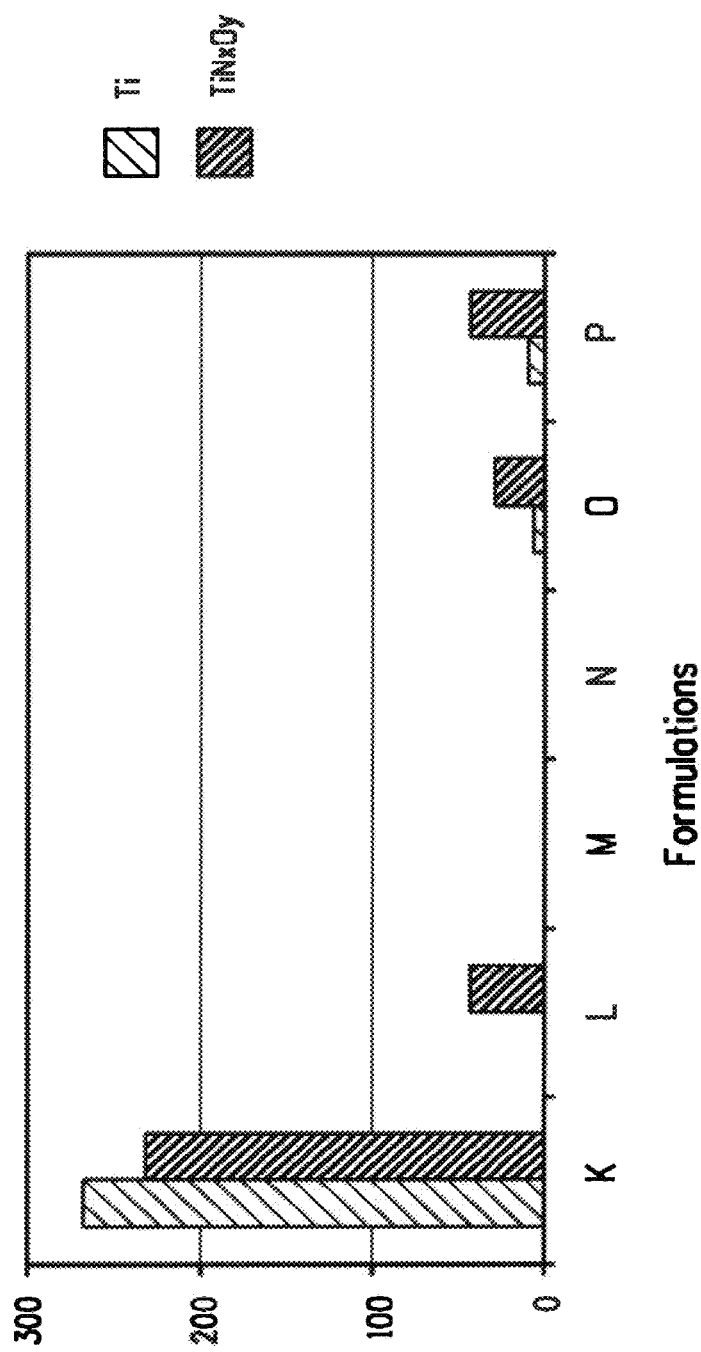
FIGS. 4a-4b are bar graphs which compare etch rate of certain metals after immersion in Compositions K through Y of the examples.

Test 1—Commercially available silicon wafers prepared with metal films, such as titanium and titanium oxynitride, were used in this test. The thickness of metal films on wafer coupons was measured using a Four Dimensions Four Point Probe Meter 333A. Then, the wafer coupons were immersed in the compositions shown above in Table 4 heated at 46° C., respectively, for 90 seconds to 2 minutes. After being rinsed with deionized water and dried with nitrogen flow, the thickness of the metal films on the wafers was measured. The etch rates, calculated from thickness loss and time immersed in the compositions, are shown in FIG. 4a. While the composition without AO1 (Composition K) showed a very high etch rate of titanium nitride and titanium oxynitride, all compositions containing AO1 (Compositions L through P) showed a suppressed etch rate. Etch rate results suggest that the composition containing AO1 is useful for processing semiconductor devices which comprise titanium or titanium compounds.

Figure 4B:
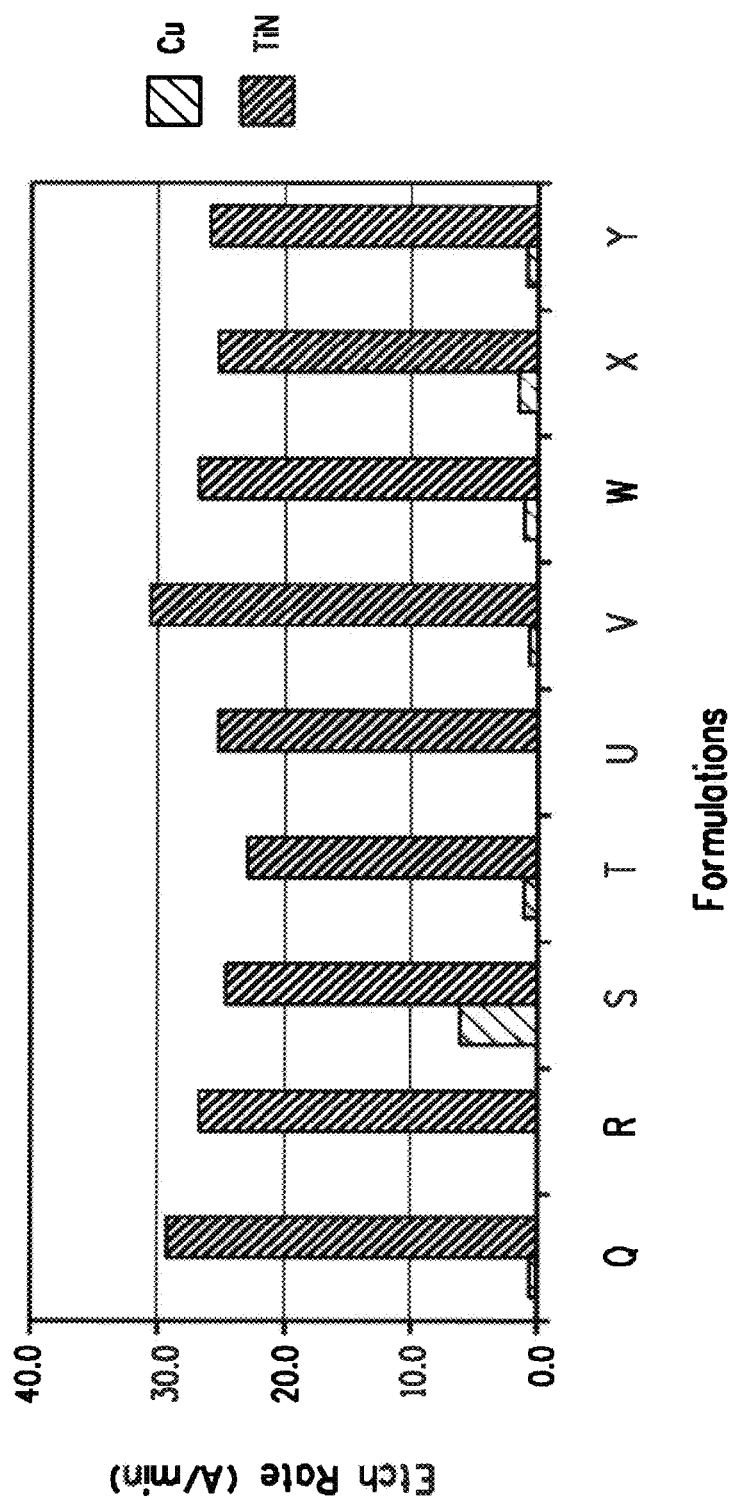

Test 2—Commercially available silicon wafers prepared with metal films, such as Cu and titanium nitride, were used in this test. The thickness loss test was carried out as described above by using the compositions shown in Table 5. The etch rates are shown in FIG. 4b. All compositions containing AO1 (Compositions Q through Y) showed high selectivity of etch rate between copper and titanium nitride. Etch rate results suggest that the compositions containing AO1 are suitably used for processing semiconductor devices comprising copper and titanium nitride, especially in devices comprising copper interconnects and titanium nitride hardmask.

While the invention has been described and illustrated herein by references to various specific materials, procedures and examples, it is understood that the invention is not restricted to the particular combinations of materials and procedures selected for that purpose. Numerous variations of such details can be implied as will be appreciated by those skilled in the art. It is intended that the specification and examples be considered as exemplary, only, with the true scope and spirit of the invention being indicated by the following claims. All references, patents, and patent applications referred to in this application are herein incorporated by reference in their entirety.

The invention claimed is:

1. A semiconductor processing composition which is compatible with substrates comprising copper, said composition comprising at least one amidoxime compound wherein said amidoxime compound contains two or more amidoxime functional groups and is present in the composition at a concentration in the range of from about 0.1 mol/dm$^3$ to about 1.0 mol/dm$^3$ and said semiconductor processing composition contains one or more additional components selected from water, water miscible organic solvents, an acid, a base, an activator, one or more compounds having oxidation and reduction potential, chelating agents, surfactants, a source of fluoride ions and/or mixtures thereof.

2. The semiconductor processing composition of claim 1, wherein the amidoxime compound is selected from the group consisting of 1,2,3,4,5,6-hexakis-O-[3-(hydroxyamino)-3-iminopropyl]hexitol; 3,3',3'',3'''-(ethane-1,2-diylbis(azanetriyl))tetrakis(N'-hydroxypropanimidamide); 3,3'-(ethane-1,2-diylbis(oxy))bis(N'-hydroxypropanimidamide); 3,3'-(piperazine-1,4-diyl)bis(N'-hydroxypropanimidamide); 3,3',3''-nitrilotris(N'-hydroxypropanimidamide); 3,3'-(2,2-bis((3-(hydroxyamino)-3-iminopropoxy)methyl)propane-1; 3-diyl)bis(oxy)bis(N-hydroxypropanimidamide); 3,3'-(2,2'-(methylazanediyl)bis(ethane-2,1-diyl)bis(oxy))bis(N'-hydroxypropanimidamide); N,N-bis(3-amino-3-(hydroxyimino)propyl)acetamide; 3,3'-(2-(N'-hydroxycarbamimidoyl)phenylazanediyl)bis(N'-hydroxypropanimidamide); 3,3'-(2,2'-(3-amino-3-(hydroxyimino)propylazanediyl)bis(ethane-2,1-diyl))bis(oxy)bis(N'-hydroxypropanimidamide); 3,3'-azanediylbis(N'-hydroxypropanimidamide); N'1,N'6-dihydroxyadipimidamide; ,N'1,N'10-dihydroxydecanebis(imidamide); 2,2'-azanediylbis(N'-hydroxyacetimidamide); and mixtures thereof.

3. The semiconductor processing composition of claim 1, wherein the composition is aqueous.

4. The semiconductor processing composition of claim 1, wherein the amidoxime compound is selected from the group consisting of 1,2-bis-O-[3-(hydroxyamino)-3-iminopropyl]hexitol; 1,3-bis-O-[3(hydroxyamino)-3-iminopropyl]hexitol; 1,4-bis-O-[3-(hydroxyamino)-3-iminopropyl]hexitol; 1,5-bis-O-[3-(hydroxyamino)-3-iminopropyl]hexitol; 1,6-bis-O-[3-(hydroxyamino)-3-iminopropyl]hexitol; 2,3-bis-O-[3-(hydroxyamino)-3-iminopropyl]hexitol; 2,4-bis-O-[3-(hydroxyamino)-3-iminopropyl]hexitol; 2,5-bis-O-[3-(hydroxyamino)-3-iminopropyl]hexitol; 3,4-bis-O-[3-(hydroxyamino)-3-iminopropyl]hexitol; 1,2,3-tris-O-[3-(hydroxyamino)-3-iminopropyl]hexitol; 1,2,4-tris-O-[3-(hydroxyamino)-3-iminopropyl]hexitol; 1,2,5-tris-O-[3-(hydroxyamino)-3-iminopropyl]hexitol; 1,2,6-tris-O-[3-(hydroxyamino)-3-iminopropyl]hexitol; 1,3,4-tris-O-[3-(hydroxyamino)-3-iminopropyl]hexitol; 1,3,5-tris-O-[3-(hydroxyamino)-3-iminopropyl]hexitol; 1,3,6-tris-O-[3-(hydroxyamino)-3-iminopropyl]hexitol; 1,4,5-tris-O-[3-(hydroxyamino)-3-iminopropyl]hexitol; 1,4,6-tris-O-[3-(hydroxyamino)-3-iminopropyl]hexitol; 2,3,4-tris-O-[3-(hydroxyamino)-3-iminopropyl]hexitol; 2,3,5-tris-O-[3-(hydroxyamino)-3-iminopropyl]hexitol; 3,4,5-tris-O-[3-(hydroxyamino)-3-iminopropyl]hexitol; 1,2,3,4-tetrakis-O-[3-(hydroxyamino)-3-iminopropyl]hexitol; 1,2,3,5-tetrakis-O-[3-(hydroxyamino)-3-iminopropyl]hexitol; 1,2,3,6-tetrakis-O-[3-(hydroxyamino)-3-iminopropyl]hexitol; 1,2,4,5-tetrakis-O-[3-(hydroxyamino)-3-iminopropyl]hexitol; 1,2,4,6-tetrakis-O-[3-(hydroxyamino)-3-iminopropyl]hexitol; 1,2,5,6-tetrakis-O-[3-(hydroxyamino)-3-iminopropyl]hexitol; 1,3,4,5-tetrakis-O-[3-(hydroxyamino)-3-iminopropyl]hexitol 1,3,4,6-tetrakis-O-[3-(hydroxyamino)-3-iminopropyl]hexitol; 2,3,4,5-tetrakis-O-[3-(hydroxyamino)-3-iminopropyl]hexitol; 1,2,3,4,5-pentakis-O-[3-(hydroxyamino)-3-iminopropyl]hexitol; 1,3,4,5,6-pentakis-O-[3-(hydroxyamino)-3-iminopropyl]hexitol 1,2,4,5,6-pentakis-O-[3-(hydroxyamino)-3-iminopropyl]hexitol; and mixtures thereof.

5. The semiconductor processing composition of claim 1, wherein the amidoxime compound is selected from the group consisting of 1,2-bis-O-[3-(hydroxyamino)-3-iminopropyl]pentitol; 1,3-bis-O-[3-(hydroxyamino)-3-iminopropyl]pentitol; 1,4-bis-O-[3-(hydroxyamino)-3-iminopropyl]pentitol; 1,5-bis-O-[3-(hydroxyamino)-3-iminopropyl]pentitol; 2,3-bis-O-[3-(hydroxyamino)-3-iminopropyl]pentitol; 2,4-bis-O-[3-(hydroxyamino)-3-iminopropyl]pentitol; 1,2,3-tris-O-[3-(hydroxyamino)-3-iminopropyl]pentitol; 1,2,4-tris-O-[3-(hydroxyamino)-3-iminopropyl]pentitol; 1,3,4-tris-O-[3-(hydroxyamino)-3-iminopropyl]pentitol; 1,3,5-tris-O-[3-(hydroxyamino)-3-iminopropyl]pentitol; 2,3,4-tris-O-[3-(hydroxyamino)-3-iminopropyl]pentitol; 1,2,3,4-tetrakis-O-[3-(hydroxyamino)-3-iminopropyl]pentitol; 1,2,3,5-tetrakis-O-[3-(hydroxyamino)-3-iminopropyl]pentitol; 1,2,4,5-tetrakis-O-[3-(hydroxyamino)-3-iminopropyl]pentitol; 1,2,3,4,5-pentakis-O-[3-(hydroxyamino)-3-iminopropyl] pentitol and mixtures thereof.

6. A method for removing one or more of photoresist, polymeric materials, etching residues and/or copper oxides from a semiconductor substrate comprising applying to the semiconductor substrate an effective amount of a processing composition comprising at least one amidoxime compound wherein said at least one amidoxime compound contains two or more amidoxime functional groups and said processing composition contains one or more additional components selected from water, water miscible organic solvents, an acid, a base, an activator, one or more compounds having oxidation and reduction potential, chelating agents, surfactants, a source of fluoride ions and/or mixtures thereof.

7. The method of claim 6 wherein the semiconductor substrate comprises copper, low-k dielectric material, titanium nitride, and/or titanium oxynitride.

8. The method of claim 7 wherein said at least one amidoxime compound is selected from the group consisting of 1,2,3,4,5,6-hexakis-O-[3-(hydroxyamino)-3-iminopropyl] hexitol; 3,3',3'',3'''-(ethane-1,2-diylbis(azanetriyl))tetrakis(N'-hydroxypropanimidamide); 3,3'-(ethane-1,2-diylbis(oxy))bis(N'-hydroxypropanimidamide); 3,3'-(piperazine-1,4-diyl)bis(N'-hydroxypropanimidamide); 3,3',3''-nitrilotris(N'-hydroxypropanimidamide); 3,3'-(2,2-bis((3-(hydroxyamino)-3-iminopropoxy)methyl)propane-1; 3-diyl)bis(oxy)bis(N-hydroxypropanimidamide); 3,3'-(2,2'-(methylazanediyl)bis(ethane-2,1-diyl)bis(oxy))bis(N'-hydroxypropanimidamide); N,N-bis(3-amino-3-(hydroxyimino)propyl)acetamide; 3,3'-(2-(N'-hydroxycarbamimidoyl)phenylazanediyl)bis(N'-hydroxypropanimidamide); 3,3'-(2,2'-(3-amino-3-(hydroxyimino)propylazanediyl)bis(ethane-2,1-diyl))bis(oxy)bis(N'-hydroxypropanimidamide); and mixtures thereof.

9. The method of claim 7, wherein said at least one amidoxime compound is selected from the group consisting of 1,2-bis-O-[3-(hydroxyamino)-3-iminopropyl]hexitol; 1,3-bis-O-[3-(hydroxyamino)-3-iminopropyl]hexitol; 1,4-bis-O-[3-(hydroxyamino)-3-iminopropyl]hexitol; 1,5-bis-O-[3-(hydroxyamino)-3-iminopropyl]hexitol; 1,6-bis-O-[3-(hydroxyamino)-3-iminopropyl]hexitol; 2,3-bis-O-[3-(hydroxyamino)-3-iminopropyl]hexitol; 2,4-bis-O-[3-(hydroxyamino)-3-iminopropyl]hexitol; 2,5-bis-O-[3-(hydroxyamino)-3-iminopropyl]hexitol; 3,4-bis-O-[3-(hydroxyamino)-3-iminopropyl]hexitol; 1,2,3-tris-O-[3-(hydroxyamino)-3-iminopropyl]hexitol; 1,2,4-tris-O-[3-(hydroxyamino)-3-iminopropyl]hexitol; 1,2,5-tris-O-[3-(hydroxyamino)-3-iminopropyl]hexitol; 1,2,6-tris-O-[3-(hydroxyamino)-3-iminopropyl]hexitol; 1,3,4-tris-O-[3-(hydroxyamino)-3-iminopropyl]hexitol; 1,3,5-tris-O-[3-(hydroxyamino)-3-iminopropyl]hexitol; 1,3,6-tris-O-[3-(hydroxyamino)-3-iminopropyl]hexitol; 1,4,5-tris-O-[3-(hydroxyamino)-3-iminopropyl]hexitol; 1,4,6-tris-O-[3-(hydroxyamino)-3-iminopropyl]hexitol; 2,3,4-tris-O-[3-(hydroxyamino)-3-iminopropyl]hexitol; 2,3,5-tris-O-[3-(hydroxyamino)-3-iminopropyl]hexitol; and 3,4,5-tris-O-[3-(hydroxyamino)-3-iminopropyl]hexitol; 1,2,3,4-tetrakis-O-[3-(hydroxyamino)-3-iminopropyl]hexitol; 1,2,3,5-tetrakis-O-[3-(hydroxyamino)-3-iminopropyl]hexitol; 1,2,3,6-tetrakis-O-[3-(hydroxyamino)-3-iminopropyl]hexitol; 1,2,4,5-tetrakis-O-[3-(hydroxyamino)-3-iminopropyl]hexitol; 1,2,4,6-tetrakis-O-[3-(hydroxyamino)-3-iminopropyl]hexitol; 1,2,5,6-tetrakis-O-[3-(hydroxyamino)-3-iminopropyl]hexitol; 1,3,4,5-tetrakis-O-[3-(hydroxyamino)-3-iminopropyl]hexitol; 1,3,4,6-tetrakis-O-[3-(hydroxyamino)-3-iminopropyl]hexitol; 2,3,4,5-tetrakis-O-[3-(hydroxyamino)-3-iminopropyl]hexitol; 1,2,3,4,5-pentakis-O-[3-(hydroxyamino)-3-iminopropyl]hexitol; 1,3,4,5,6-pentakis-O-[3-(hydroxyamino)-3-iminopropyl]hexitol 1,2,4,5,6-pentakis-O-[3-(hydroxyamino)-3-iminopropyl]hexitol; and mixtures thereof.

10. The method of claim 7, wherein said at least one amidoxime compound is selected from the group consisting of 1,2-bis-O-[3-(hydroxyamino)-3-iminopropyl]pentitol; 1,3-bis-O-[3-(hydroxyamino)-3-iminopropyl]pentitol; 1,4-bis-O-[3-(hydroxyamino)-3-iminopropyl]pentitol; 1,5-bis-O-[3-(hydroxyamino)-3-iminopropyl]pentitol; 2,3-bis-O-[3-(hydroxyamino)-3-iminopropyl]pentitol; 2,4-bis-O-[3-(hydroxyamino)-3-iminopropyl]pentitol; 1,2,3-tris-O-[3-(hydroxyamino)-3-iminopropyl]pentitol; 1,2,4-tris-O-[3-(hydroxyamino)-3-iminopropyl]pentitol; 1,3,4-tris-O-[3-(hydroxyamino)-3-iminopropyl]pentitol; 1,3,5-tris-O-[3-(hydroxyamino)-3-iminopropyl]pentitol; 2,3,4-tris-O-[3-(hydroxyamino)-3-iminopropyl]pentitol; 1,2,3,4-tetrakis-O-[3-(hydroxyamino)-3-iminopropyl]pentitol; 1,2,3,5-tetrakis-O-[3-(hydroxyamino)-3-iminopropyl]pentitol; 1,2,4,5-tetrakis-O-[3-(hydroxyamino)-3-iminopropyl]pentitol; 1,2,3,4,5-pentakis-O-[3-(hydroxyamino)-3-iminopropyl]pentitol and mixtures thereof.

11. An aqueous semiconductor processing composition formulated for use in post etch residue removal during semiconductor device manufacturing wherein said semiconductor device contains a metal hard mask comprising titanium or titanium compounds and wherein the aqueous semiconductor processing composition is characterized by containing at least one amidoxime compound wherein said at least one amidoxime compound contains two or more amidoxime functional groups and one or more additional components selected from water miscible organic solvents, an acid, a base, an activator, one or more compounds having oxidation and reduction potential, chelating agents, surfactants, a source of fluoride ions and/or mixtures thereof.

12. The aqueous semiconductor processing composition of claim 11 wherein the at least one amidoxime compound is 1,2,3,4,5,6-hexakis-O-[3-(hydroxyamino)-3-iminopropyl]hexitol.

* * * * *